(12) United States Patent
Lee et al.

(10) Patent No.: US 7,750,759 B1
(45) Date of Patent: Jul. 6, 2010

(54) MULTI-MODE MEMS RESONATOR ARRAY

(75) Inventors: Seungbae Lee, Greensboro, NC (US); Kushal Bhattacharjee, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 100 days.

(21) Appl. No.: 12/112,278

(22) Filed: Apr. 30, 2008

Related U.S. Application Data

(60) Provisional application No. 60/914,994, filed on Apr. 30, 2007, provisional application No. 60/942,265, filed on Jun. 6, 2007.

(51) Int. Cl.
*H03H 9/00* (2006.01)
*H03H 9/54* (2006.01)

(52) U.S. Cl. ...................................... 333/186; 333/189
(58) Field of Classification Search ................. 333/186, 333/187, 188, 189, 197, 198
See application file for complete search history.

(56) References Cited

U.S. PATENT DOCUMENTS

| 7,005,946 B2 * | 2/2006 | Duwel et al. ................. 333/187 |
| 7,312,674 B2 * | 12/2007 | Duwel et al. ................. 333/186 |
| 7,492,241 B2 * | 2/2009 | Piazza et al. ................. 333/189 |

* cited by examiner

*Primary Examiner*—Dean O Takaoka
(74) *Attorney, Agent, or Firm*—Withrow & Terranova, PLLC

(57) ABSTRACT

The present invention relates to a multi-mode micro-electromechanicalsystems (MEMS) resonator system that may provide low motional resistance and a high quality factor by using a resonating structure that includes multiple parallel-coupled longitudinally resonating bodies, each of which has multiple resonating segments adjacent to one another along an axis. The multi-mode MEMS resonator system may provide high acoustic velocity by using the micro-structure of MEMS technology. The multi-mode MEMS resonator system may include electrostatic transducers, piezoelectric transducers, or both. The present invention includes multiple embodiments that may include different configurations of the resonating structure.

25 Claims, 20 Drawing Sheets

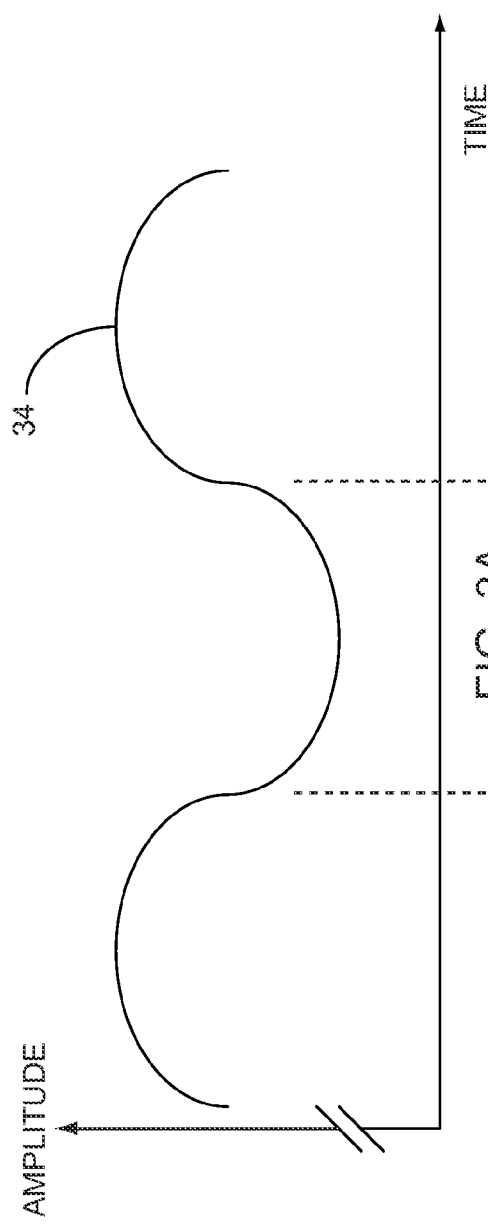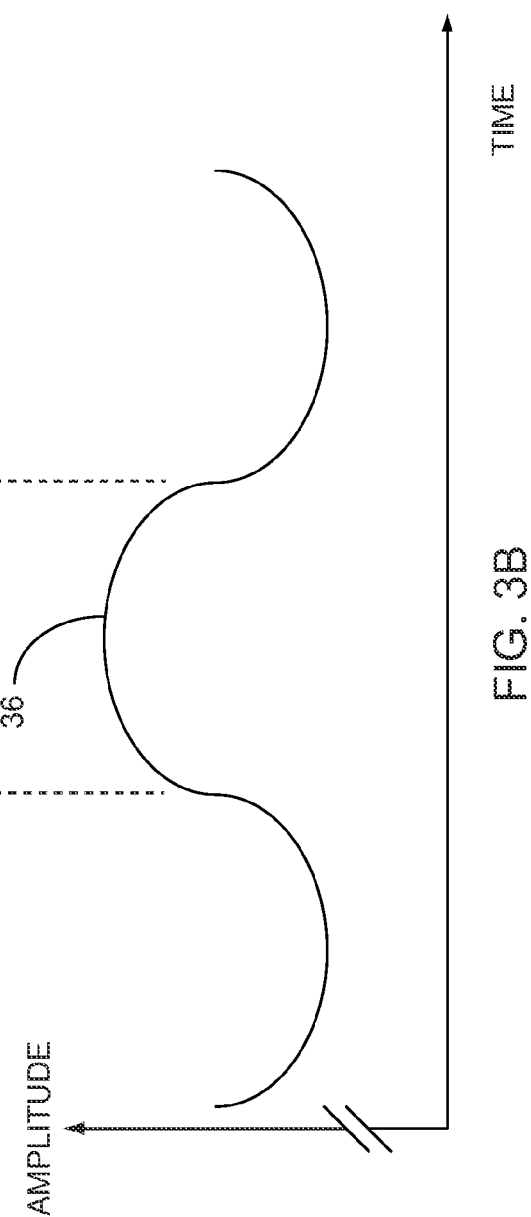

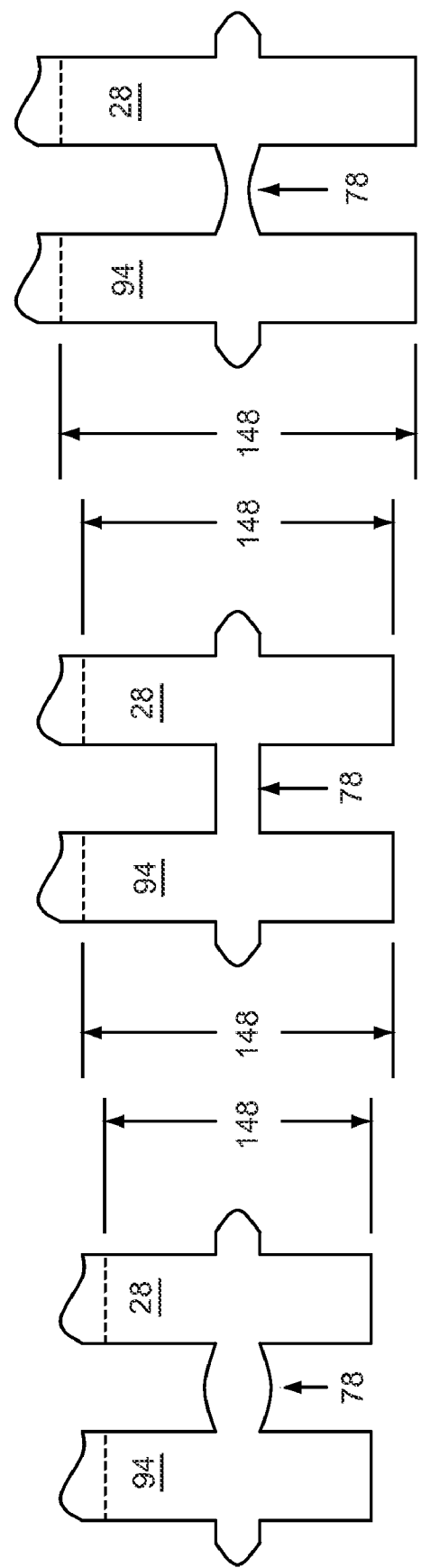

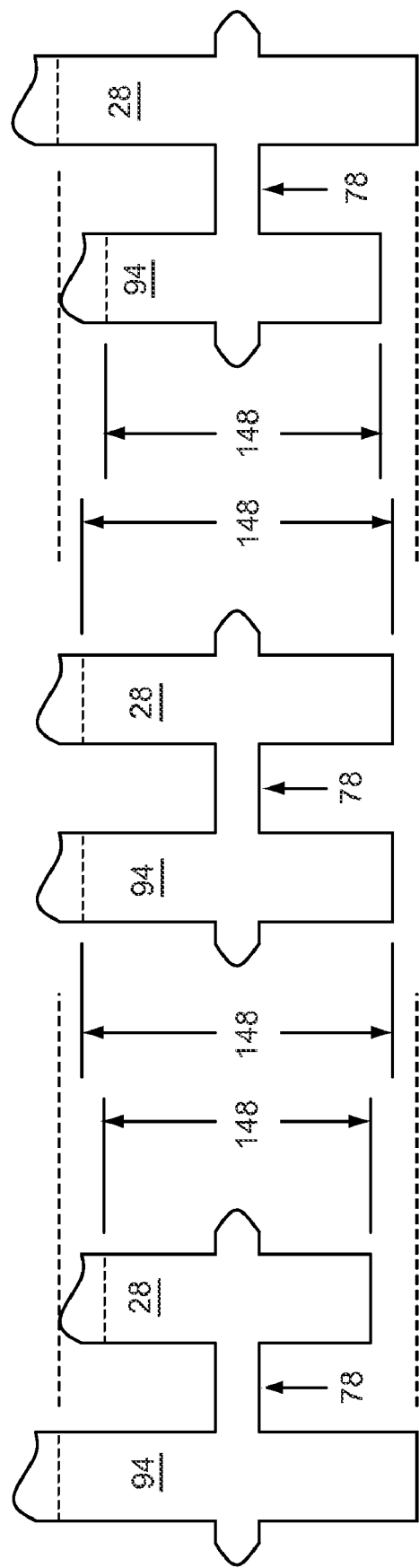

US 7,750,759 B1

MULTI-MODE MEMS RESONATOR ARRAY

This application claims the benefit of provisional patent application Ser. No. 60/914,994, filed Apr. 30, 2007, the disclosure of which is hereby incorporated herein by reference in its entirety.

This application also claims the benefit of provisional patent application Ser. No. 60/942,265, filed Jun. 6, 2007, the disclosure of which is hereby incorporated herein by reference in its entirety.

FIELD OF THE INVENTION

Embodiments of the present invention relate to microelectromechanicalsystems (MEMS) resonators, which may be used in radio frequency (RF) communications systems.

BACKGROUND OF THE INVENTION

A resonator is an electro-mechanical device that can mechanically resonate at a resonant frequency and can convert electrical signals into mechanical vibrations, and vice versa. The combination of electrical signal conversion and mechanical resonance characteristics creates a device that has useful electrical characteristics. Specifically, the resonator may be used in an electrical oscillator circuit, which provides an electrical signal at the resonant frequency. Alternatively, the resonator may be used in an electrical filter circuit that filters electrical signals based on electrical impedances associated with the mechanical resonance characteristics of the resonator.

Certain electrical characteristics may be desirable for resonators. Motional resistance is related to the effectiveness of a resonator in converting electrical signals into mechanical vibrations, and vice versa. A resonator that has high coupling coefficients in converting signals from the electrical domain to the mechanical domain and back may provide a low motional resistance, which may be useful in many applications. A resonator having a high quality factor may enable circuits having high signal integrity and high efficiency. The resonant frequency is related to an acoustic velocity of a resonator. Higher acoustic velocities produce higher resonant frequencies, which may be useful in frequency reference circuits or in filter circuits. Thus, there is a need for a resonator that has low motional resistance, a high quality factor, and high acoustic velocity.

SUMMARY OF THE EMBODIMENTS

The present invention relates to a multi-mode micro-electromechanicalsystems (MEMS) resonator system that may provide low motional resistance and a high quality factor by using a resonating structure that includes multiple parallel-coupled longitudinally resonating bodies, each of which has multiple resonating segments adjacent to one another along an axis. The MEMS resonator system may provide high acoustic velocity by using the inherent properties of the materials used in the micro-structure of MEMS technology. The MEMS resonator system may include electrostatic transducers, electrostrictive transducers, piezoelectric transducers, or any combination thereof. The present invention includes multiple embodiments that may include different configurations of the resonating structure.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 3A and 3B are graphs showing the phase relationship between a first resonating length and a second resonating length of the dual-mode longitudinal resonator illustrated in FIG. 2.

Figure 12:
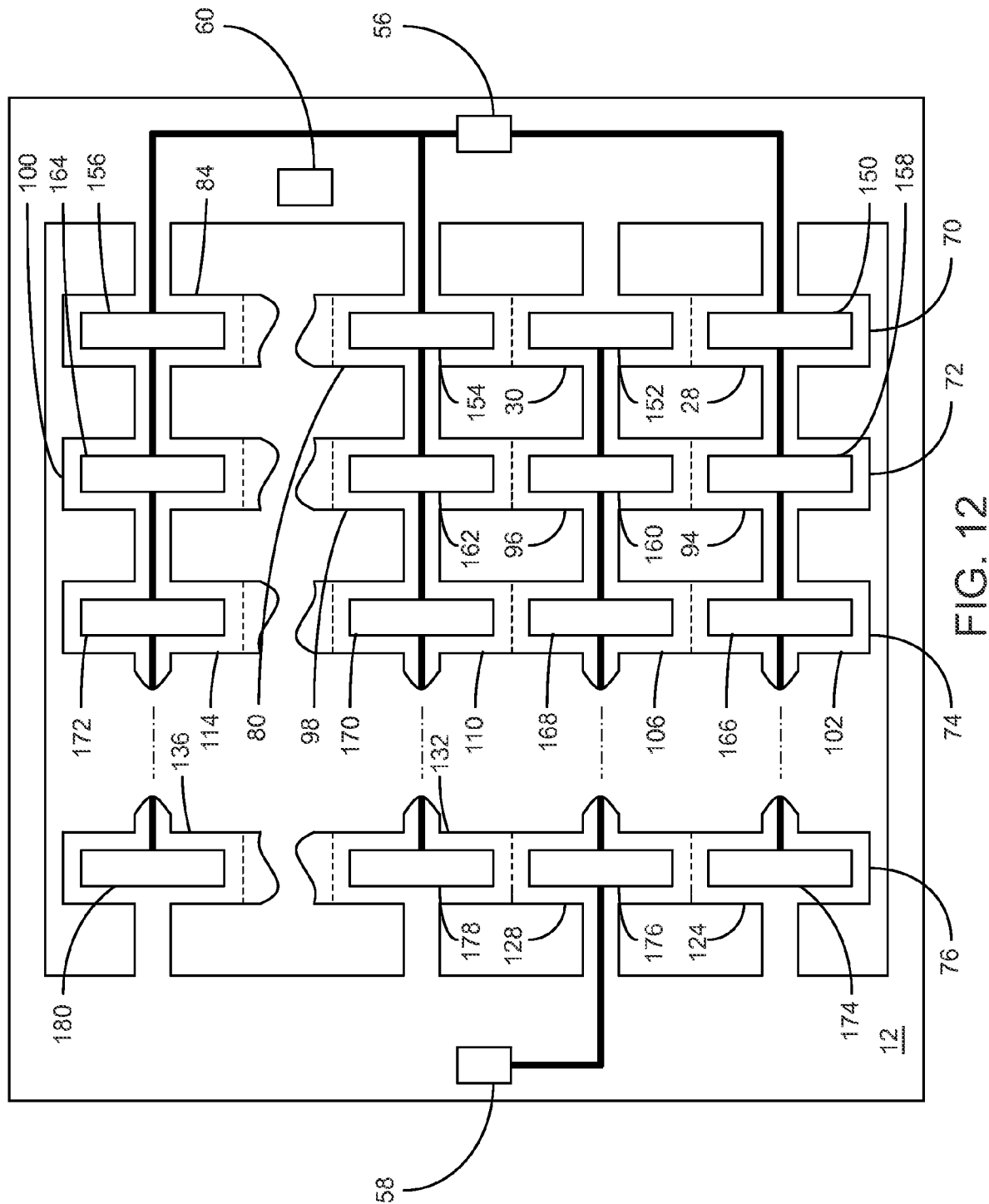
FIG. 12 shows a two-dimensional top-view of the array of multi-mode longitudinally resonating bodies illustrated in FIG. 11, according to a first embodiment of the resonating structure.
Figure 13:
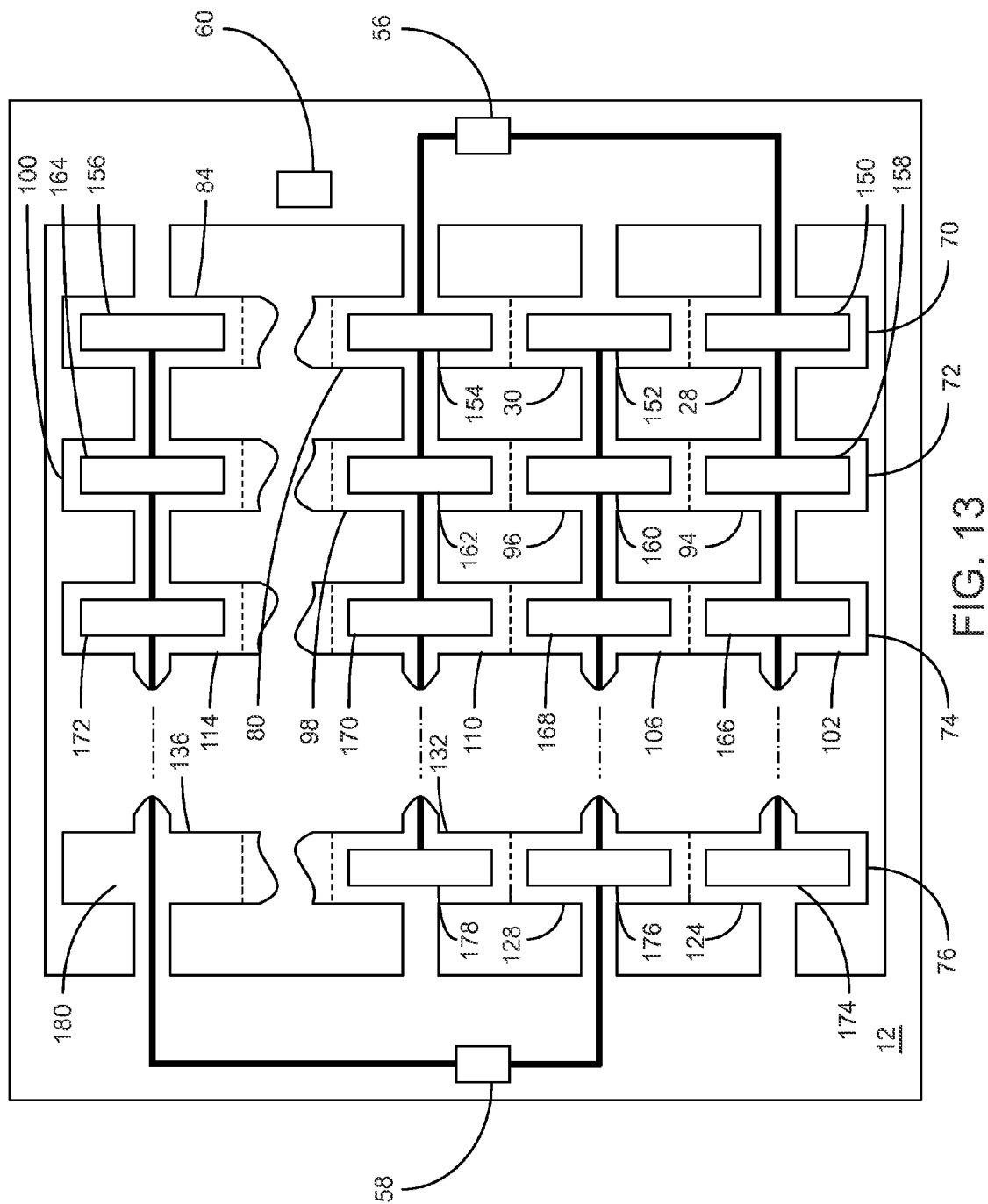
FIG. 13 shows a two-dimensional top-view of the array of multi-mode longitudinally resonating bodies illustrated in FIG. 11, according to a second embodiment of the resonating structure.

FIGS. 18A, 18B, and 18C show details of an intra-array coupler between a first resonating segment and a second body first resonating segment in the first and second embodiments of the resonating structure illustrated in FIGS. 12 and 13.

FIGS. 19A, 19B, and 19C show details of the intra-array coupler between the first resonating segment and the second body first resonating segment in the third, fourth, fifth, and sixth embodiments of the resonating structure illustrated in FIGS. 14, 15, 16, and 17.

Figure 20C:
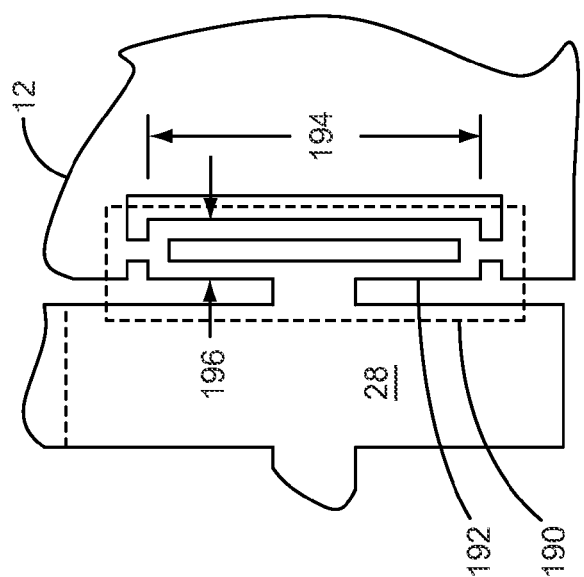
Figure 20B:
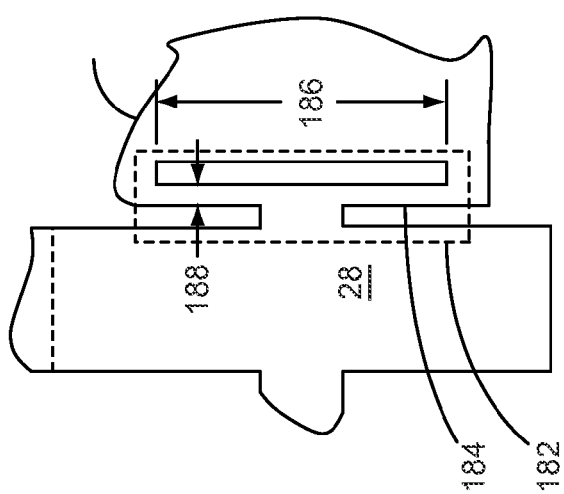
Figure 20A:
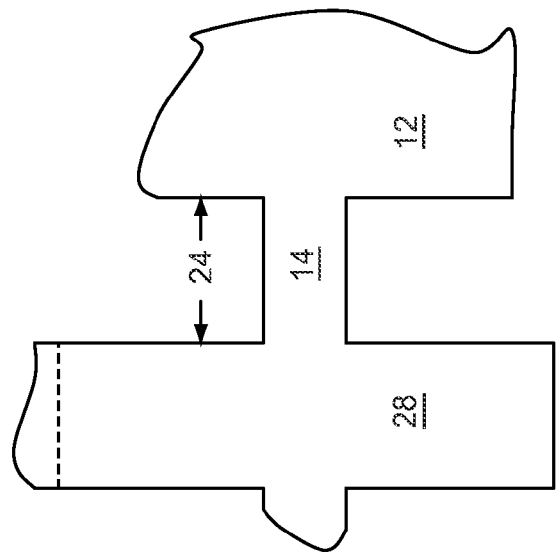

FIGS. 20A and 20B illustrate details of a dual-clamped beam anchor as an alternative to an anchor, according to one embodiment of the present invention.

FIG. 20C illustrates details of a symmetric tuning fork beam anchor as another alternative to the anchor, according to an alternate embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a multi-mode micro-electromechanicalsystems (MEMS) resonator system that may provide low motional resistance and a high quality factor by using a resonating structure that includes multiple parallel-coupled longitudinally resonating bodies, each of which has multiple resonating segments adjacent to one another along an axis. The MEMS resonator system may provide high acoustic velocity by using the micro-structure of MEMS technology. The MEMS resonator system may include electrostatic transducers, electrostrictive transducers, piezoelectric transducers, or any combination thereof. The present invention includes multiple embodiments that may include different configurations of the resonating structure.

Figure 1:
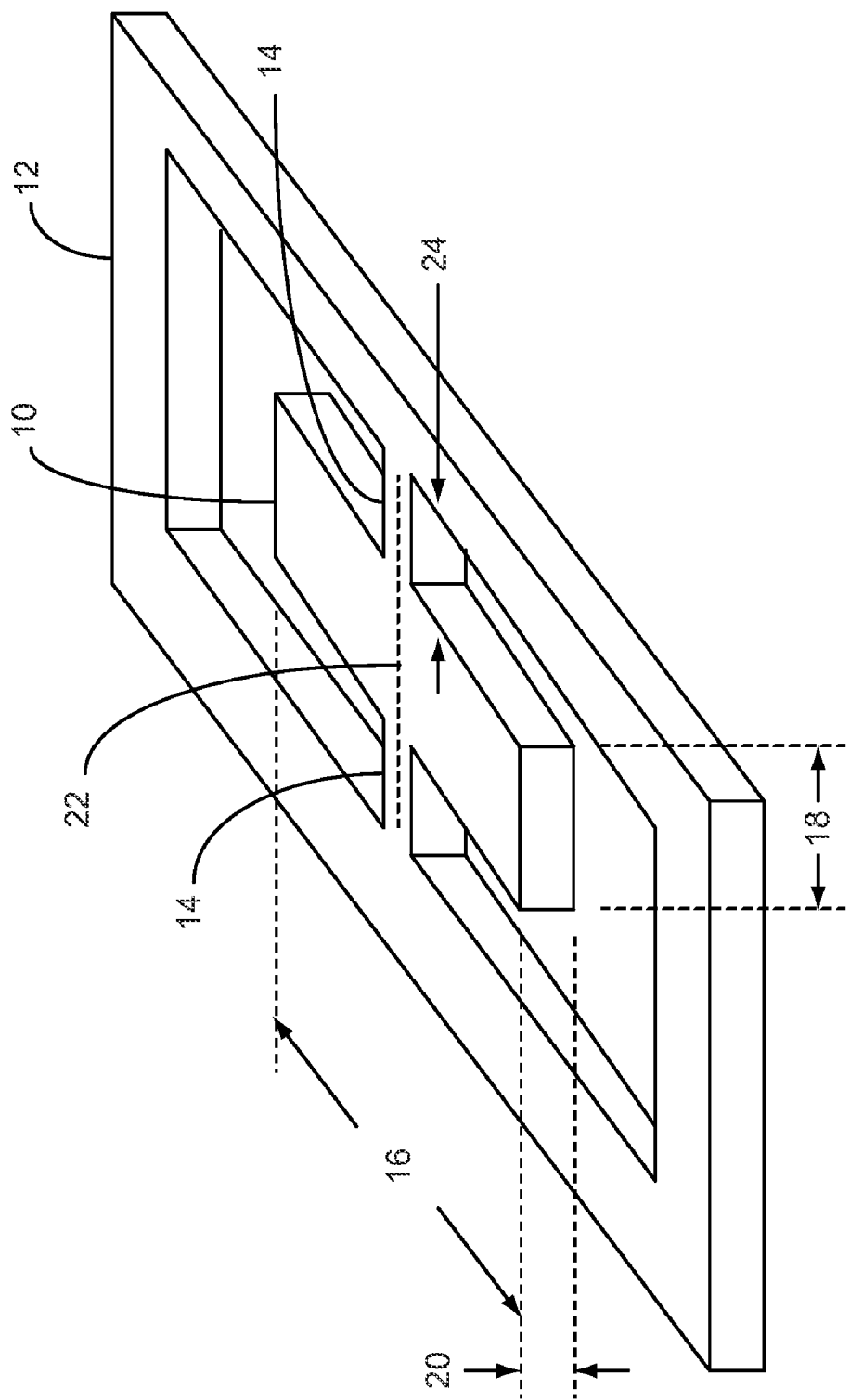
FIG. 1 shows a three-dimensional top-view of a single-mode longitudinal resonator, according to the prior art.

FIG. 1 shows a three-dimensional top-view of a single-mode longitudinal resonator 10, according to the prior art. The single-mode longitudinal resonator 10 is suspended from a supporting structure 12 using two anchors 14 and has a resonating length 16, a width 18, and a height 20. The single-mode longitudinal resonator 10 longitudinally resonates about a null axis 22, also called a nodal axis, by compressing and expanding its resonating length 16. Therefore, when resonating, the single-mode longitudinal resonator 10 has a maximum length, which is greater than the resonating length 16 while at rest, and a minimum length, which is less than the resonating length 16 while at rest. The anchors 14 are located at the null axis 22. Ideally, the single-mode longitudinal resonator 10 remains stationary at the null axis 22 when resonating.

Each of the two anchors 14 has an anchor length 24, which is about equal to the distance between the single-mode longitudinal resonator 10 and the supporting structure 12. To vibrate, or operate, at a desired resonant frequency, the resonating length 16 may be about equal to one-half of a wavelength of the resonant frequency of the single-mode longitudinal resonator 10, and the anchor length 24 may be about equal to one-quarter of the wavelength of the resonant frequency of the single-mode longitudinal resonator 10.

Figure 2:
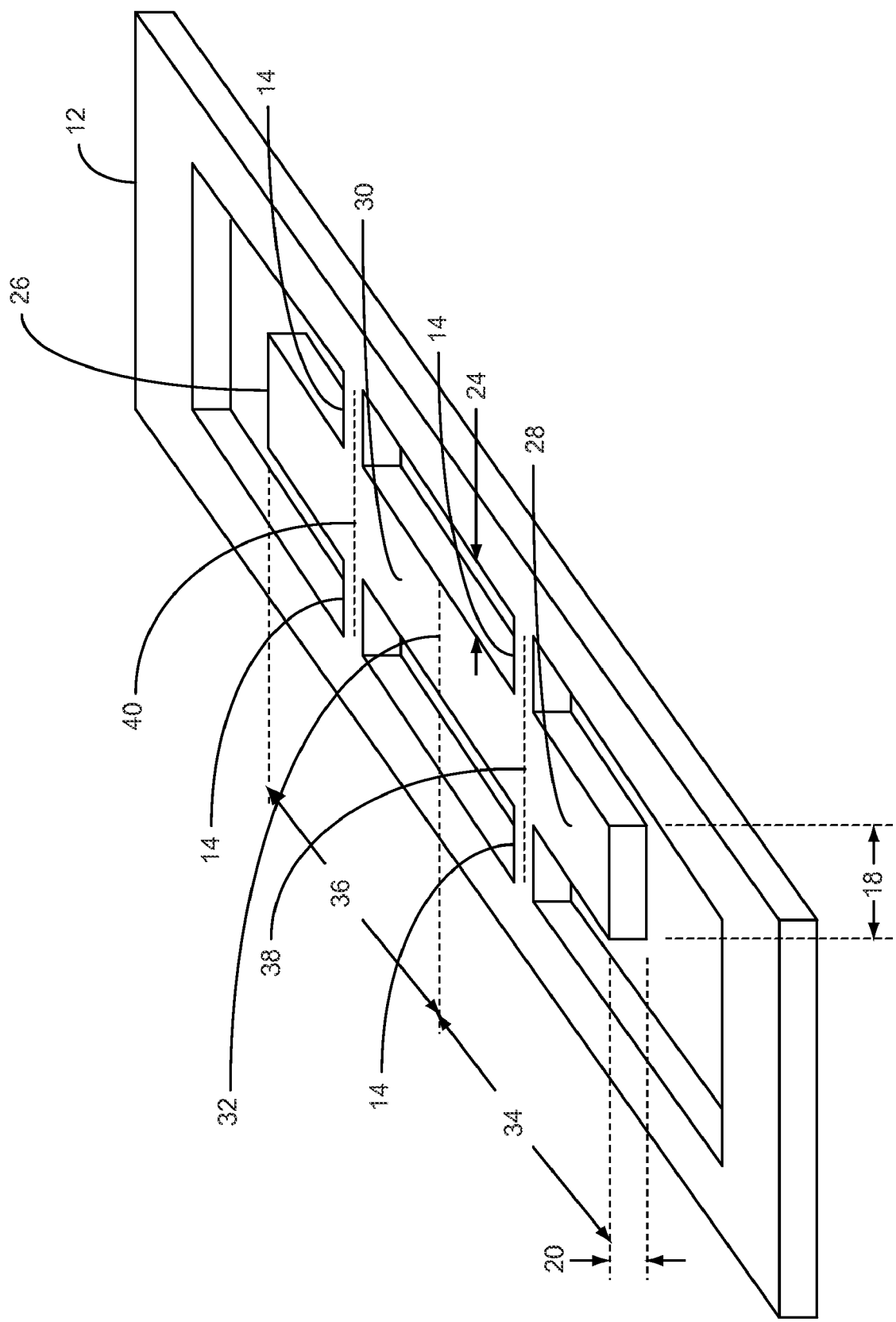
FIG. 2 shows a three-dimensional top-view of a dual-mode longitudinal resonator, according to one embodiment of the present invention.

FIG. 2 shows a three-dimensional top-view of a dual-mode longitudinal resonator 26, according to one embodiment of the present invention. The dual-mode longitudinal resonator 26 is suspended from the supporting structure 12 using four anchors 14 and has a first resonating segment 28 and a second resonating segment 30 that are adjacent to each other and meet at a mode dividing line 32. The mode of a longitudinal resonator is equal to the number of resonating segments in the longitudinal resonator. For example, a dual-mode resonator has two resonating segments, a triple-mode resonator has three resonating segments, and so on. Alternate embodiments of the present invention may include a longitudinal resonator having a mode of any number, with any number of resonating segments.

Each of the first and second resonating segments 28, 30 has a first resonating length 34 and a second resonating length 36, respectively. Additionally, each of the first and second resonating segments 28, 30 has the width 18 and the height 20. Each of the first and second resonating segments 28, 30 longitudinally resonates about a first null axis 38 and a second null axis 40, respectively, by compressing and expanding its first resonating length 34 and expanding and compressing its second resonating length 36, respectively. Therefore, when resonating, the first resonating segment 28 has a maximum length, which is greater than the first resonating length 34 while at rest, and a minimum length, which is less than the first resonating length 34 while at rest. Similarly, when resonating, the second resonating segment 30 has a maximum length, which is greater than the second resonating length 36 while at rest, and a minimum length, which is less than the second resonating length 36 while at rest.

Two of the anchors 14 are located at the first null axis 38, and ideally, when resonating, the first resonating segment 28 remains stationary at the first null axis 38. Similarly, the other two anchors 14 are located at the second null axis 40, and ideally, when resonating, the second resonating segment 30 remains stationary at the second null axis 40. To maximize the quality factor of the dual-mode longitudinal resonator 26, the first and second resonating segments 28, 30 may each resonate with the same resonant frequency with about a 180 degree phase-shift with respect to one another. As the first resonating length 34 is at a maximum, the second resonating length 36 may be at a minimum, and vice versa.

Each of the four anchors 14 has an anchor length 24, which is about equal to the distance between the dual-mode longitudinal resonator 26 and the supporting structure 12. To vibrate, or operate, at the desired resonant frequency, each of the first and second resonating lengths 34, 36 may be about equal to one-half of a wavelength of the resonant frequency, and to maximize the quality factor of the dual-mode longitudinal resonator 26, the anchor length 24 may be about equal to one-quarter of the wavelength of the resonant frequency.

The dual-mode longitudinal resonator 26 illustrated in FIG. 2 is a bar shape; however, alternate embodiments of the present invention may use longitudinal resonators of any shape. A multi-mode longitudinal resonator may longitudinally resonate or vibrate such that an overall resonator length L oscillates at a frequency given by:

$$f_o = \frac{v}{\lambda_n} = \frac{n}{2L}\sqrt{\frac{E}{\rho}}, \qquad \text{Eq. 1}$$

where n is the mode number, v and $\lambda_n$ are the velocity and wavelength of the oscillations, and E and ρ are the Young's modulus and density of the resonator material, respectively.

FIGS. 3A and 3B are graphs showing the phase relationship between the first resonating length 34 and the second resonating length 36 of the dual-mode longitudinal resonator 26 illustrated in FIG. 2, according to one embodiment of the present invention. The first and second resonating segments 28, 30 are resonating at about the same resonant frequency with about a 180 degree phase-shift with respect to one another. As the first resonating length 34 is at a maximum, the second resonating length 36 is at a minimum, and vice versa, which may maximize the quality factor of the dual-mode longitudinal resonator 26. In alternate embodiments of the present invention, a longitudinal resonator may be a mode of any number having any number of resonating segments, such that any two adjacent resonating segments resonate at about the same resonant frequency with about a 180 degree phase-shift with respect to one another.

Figure 4:
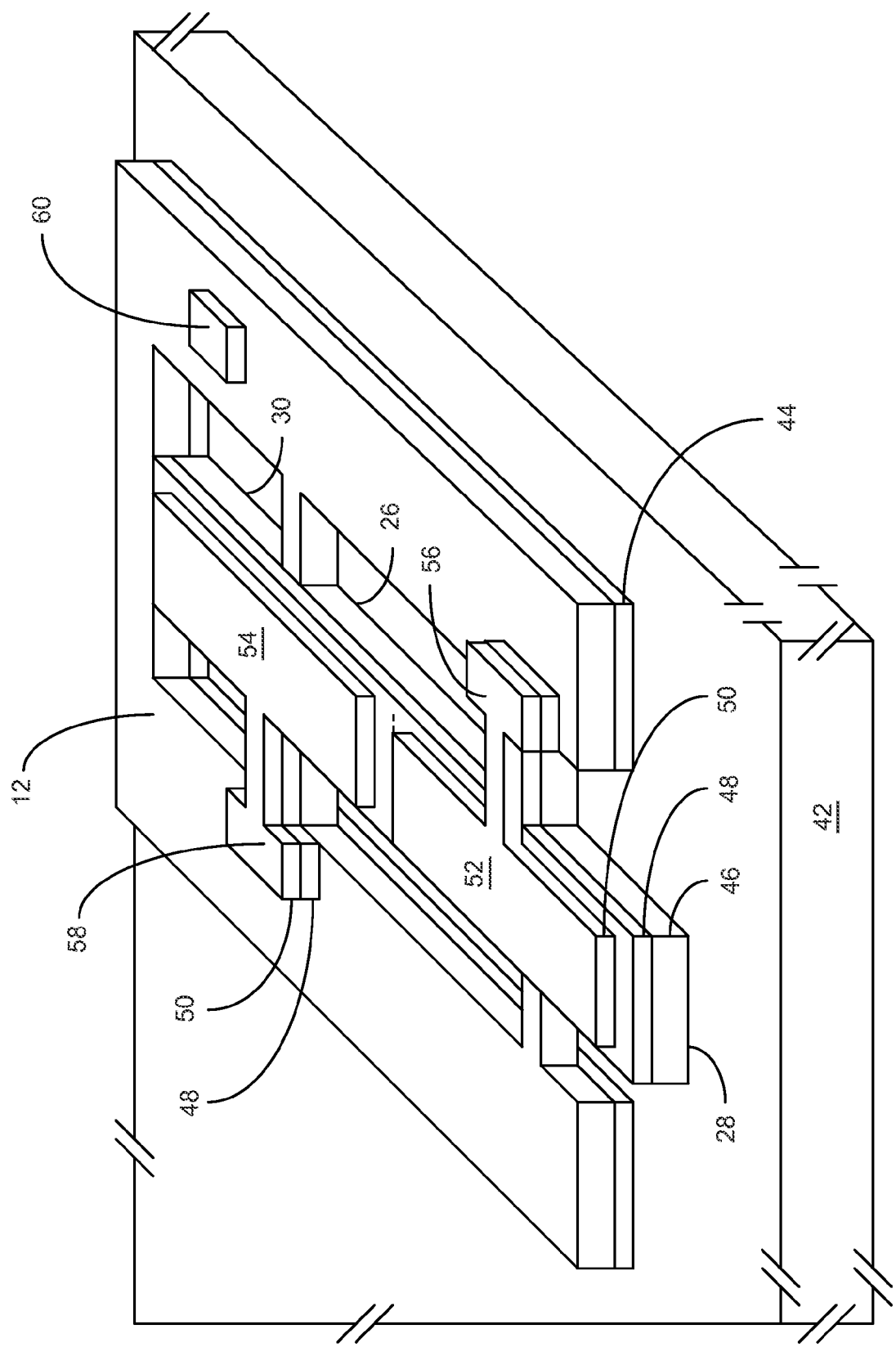
FIG. 4 shows a three-dimensional top-view of details of the dual-mode longitudinal resonator and supporting structure illustrated in FIG. 2.

FIG. 4 shows a three-dimensional top-view of details of the dual-mode longitudinal resonator 26 and the supporting structure 12 illustrated in FIG. 2. In one embodiment of the present invention, the dual-mode longitudinal resonator 26 and the supporting structure 12 are provided by a substrate 42, a first insulating layer 44 over the substrate 42, a resonating device layer 46 over the first insulating layer 44, a second insulating layer 48 over the resonating device layer 46, and a first conducting layer 50 over the second insulating layer 48. The substrate 42, the first insulating layer 44, and the resonating device layer 46 provide the supporting structure 12, and the resonating device layer 46, the second insulating layer 48, and the first conducting layer 50 provide the dual-mode longitudinal resonator 26, which is free to resonate since it does not include the first insulating layer 44, and is mechanically constrained only by the anchors 14 (FIG. 2).

The first conducting layer 50 provides a first conducting area 52 over the first resonating segment 28 and a second conducting area 54 over the second resonating segment 30. The resonating device layer 46 may include a conducting or semi-conducting material and the second insulating layer 48 may electrically insulate the first conducting area 52 from the resonating device layer 46. Therefore, the first conducting area 52, the second insulating layer 48, and the resonating device layer 46 may form a first capacitive element, which is associated with the first resonating segment 28 to form a first electrostatic resonating element. The first conducting area 52 and the resonating device layer 46 may form the conductive plates of the first capacitive element, and the second insulating layer 48 may form the dielectric of the first capacitive element. Similarly, the second insulating layer 48 may electrically insulate the second conducting area 54 from the resonating device layer 46. Therefore, the second conducting area 54, the second insulating layer 48, and the resonating device layer 46 may form a second capacitive element, which is associated with the second resonating segment 30 to form a second electrostatic resonating element.

The first conducting layer 50 and the second insulating layer 48 may provide a drive connection node 56 that is attached to the supporting structure 12, is electrically isolated from the resonating device layer 46 and the second conducting area 54, and is electrically coupled to the first conducting area 52. The first conducting layer 50 and the second insulating layer 48 may provide a sense connection node 58 that is attached to the supporting structure 12, is electrically isolated from the resonating device layer 46 and the first conducting area 52, and is electrically coupled to the second conducting area 54. A direct current (DC) connection node 60 may provide an electrical connection to the resonating device layer 46 at the supporting structure 12. The resonating device layer 46 may dominate the resonant characteristics of the first resonating segment 28, the second resonating segment 30, or both.

In an alternate embodiment of the present invention, the first conducting area 52, the second insulating layer 48, and the resonating device layer 46 may form a first electrostrictive element, which is associated with the first resonating segment 28 to form a first electrostrictive resonating element. Similarly, the second conducting area 54, the second insulating layer 48, and the resonating device layer 46 may form a second electrostrictive element, which is associated with the second resonating segment 30 to form a second electrostrictive resonating element.

In a first embodiment of the present invention, the substrate 42 may include Silicon, the first insulating layer 44 may include Silicon Dioxide or Silicon Nitride, the resonating device layer 46 may be a Silicon layer or a single-crystal Silicon (SCS) layer, the second insulating layer 48 may include a dielectric material, such as Silicon Dioxide, Silicon Nitride, Bismuth Zinc Niobate (BZN), or Barium Strontium Titanate (BST), and the first conducting layer 50 may be a metallization layer, which may include Aluminum. A Silicon-on-insulator (SOI) wafer may provide the substrate 42, the first insulating layer 44, and the resonating device layer 46, which may be an SOI device layer.

In a second embodiment of the present invention, the substrate 42 may include Silicon, the first insulating layer 44 may include Silicon Dioxide or Silicon Nitride, the resonating device layer 46 may be a Silicon layer or a SCS layer, the second insulating layer 48 may be a gate oxide layer, which may include Silicon Dioxide, Silicon Nitride, or Halfnium Oxide (HfO2), and the first conducting layer 50 may include poly-Silicon. An SOI wafer may provide the substrate 42, the first insulating layer 44, and the resonating device layer 46, which may be an SOI device layer. All or part of the dual-mode longitudinal resonator 26 and the supporting structure 12 may be provided using a complementary metal-oxide semiconductor (CMOS) fabrication process.

The thickness of the second insulating layer 48 may be between about ten nanometers and about one micrometer. In an exemplary embodiment of the present invention, the thickness of the second insulating layer 48 may be about 200 nanometers. A thickness of the first conducting layer 50 may be about 200 nanometers. In an alternate embodiment of the present invention, one or more additional layers may be included between the substrate 42 and the first insulating layer 44, between the first insulating layer 44 and the resonating device layer 46, between the resonating device layer 46 and the second insulating layer 48, between the second insulating layer 48 and over the first conducting layer 50, or any combination thereof.

In an alternate embodiment of the present invention, since the resonating device layer 46 may include a conducting or semi-conducting material and since the second insulating layer 48 may electrically insulate the first conducting area 52 from the resonating device layer 46, the second insulating layer 48 may include piezoelectric material. Therefore, the first conducting area 52, the second insulating layer 48, and the resonating device layer 46 may form a first piezoelectric transducer, which is associated with the first resonating segment 28 to form a first piezoelectric resonating element. The first conducting area 52 and the resonating device layer 46 may form the conductive plates of the first piezoelectric transducer, and the second insulating layer 48 may form the piezoelectric material of the first piezoelectric transducer. Similarly, since the second insulating layer 48 may electrically insulate the second conducting area 54 from the resonating device layer 46, the second conducting area 54, the second insulating layer 48, and the resonating device layer 46 may form a second piezoelectric transducer, which is associated with the second resonating segment 30 to form a second piezoelectric resonating element.

The first conducting layer 50 and the second insulating layer 48 may provide the drive connection node 56 that is attached to the supporting structure 12, is electrically isolated from the resonating device layer 46 and the second conducting area 54, and is electrically coupled to the first conducting area 52. The first conducting layer 50 and the second insulating layer 48 may provide the sense connection node 58 that is attached to the supporting structure 12, is electrically isolated from the resonating device layer 46 and the first conducting area 52, and is electrically coupled to the second conducting area 54. The DC connection node 60 may provide an electrical connection to the resonating device layer 46 at the supporting structure 12. The resonating device layer 46 may dominate the resonant characteristics of the first resonating segment 28, the second resonating segment 30, or both.

In a third embodiment of the present invention, the substrate 42 may include Silicon, the first insulating layer 44 may include Silicon Dioxide or Silicon Nitride, the resonating device layer 46 may be a Silicon layer or a SCS layer, the second insulating layer 48 is a piezoelectric material, such as Zinc Oxide, Lead Zirconate Titanate (PZT), Aluminum Nitride (AlN), Lithium Tantalate (LT), or Lithium Niobate (LN), and the first conducting layer 50 may be a metallization layer, which may include Aluminum. An SOI wafer may provide the substrate 42, the first insulating layer 44, and the resonating device layer 46, which may be an SOI device layer.

Figure 5:
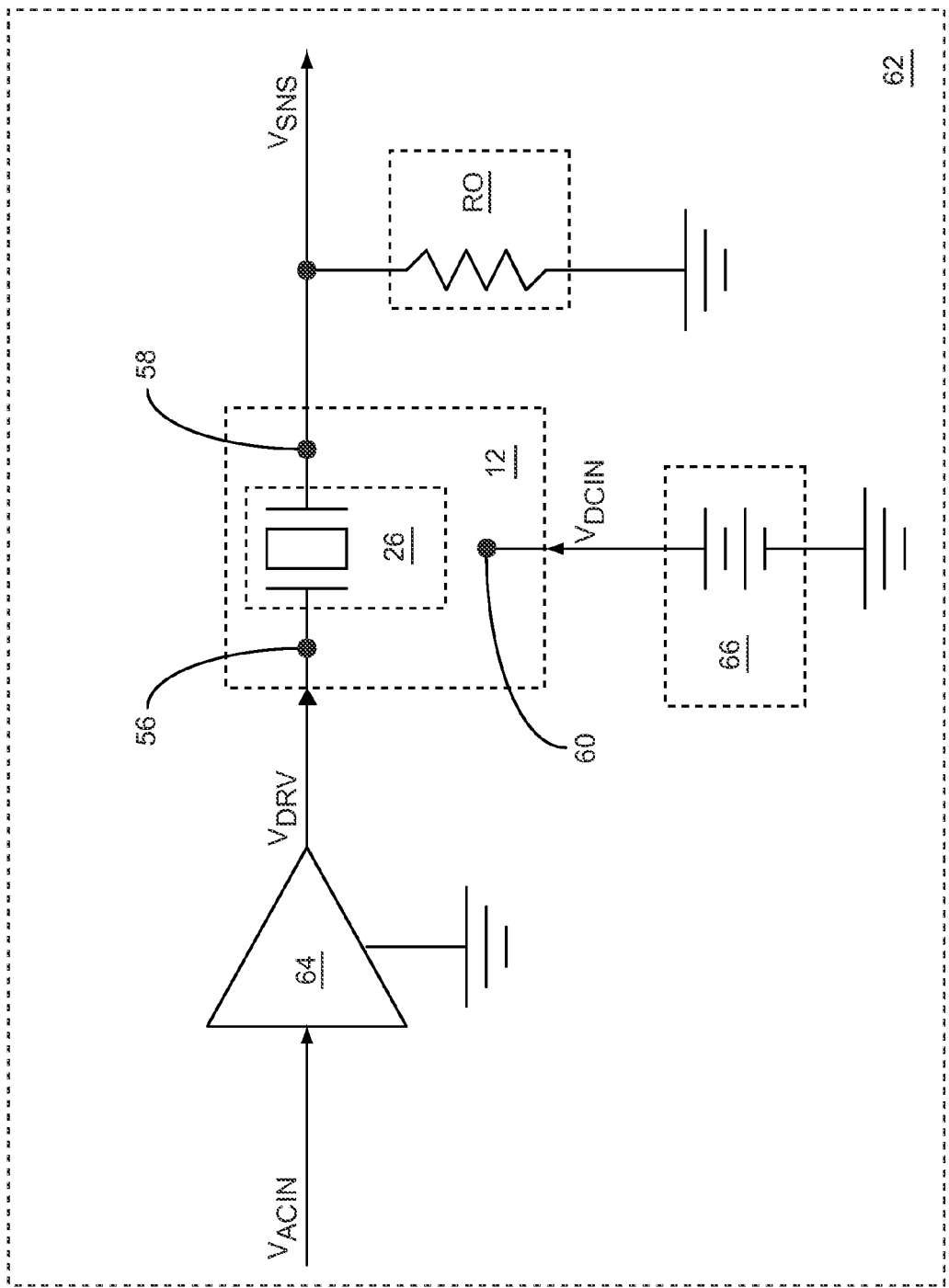
FIG. 5 shows a first resonator circuit, which includes the dual-mode longitudinal resonator and the supporting structure illustrated in FIG. 4, according to one embodiment of the present invention.

FIG. 5 shows a first resonator circuit 62, which includes the dual-mode longitudinal resonator 26 and the supporting structure 12 illustrated in FIG. 4, according to one embodiment of the present invention. An alternating current (AC) driver 64 receives and buffers an AC input signal $V_{ACIN}$ to provide an AC drive signal $V_{DRV}$ to the drive connection node 56. The sense connection node 58 provides a sense signal $V_{SNS}$, which is based on the AC drive signal $V_{DRV}$ and resonance characteristics of the dual-mode longitudinal resonator 26. In an exemplary embodiment of the present invention, an output resistive element RO is coupled between the sense connection node 58 and ground. A DC power supply 66 may provide a DC input signal $V_{DCIN}$ to the DC connection node 60. The DC input signal $V_{DCIN}$ may provide a DC bias to the first and second electrostatic resonating elements for proper resonator operation.

Since the AC drive signal $V_{DRV}$ is fed to the first conducting area 52 via the drive connection node 56, the first resonating segment 28 is a driven resonating segment. Likewise, since the second conducting area 54 provides the sense signal $V_{SNS}$ via the sense connection node 58, the second resonating segment 30 is a sensed resonating segment. The AC drive signal $V_{DRV}$ may cause vibrations in the first resonating segment 28 that are mechanically coupled to the second resonating segment 30, and generate the sense signal $V_{SNS}$ based on the resonance characteristics of the dual-mode longitudinal resonator 26.

Alternate embodiments of the present invention may use the dual-mode longitudinal resonator 26 and the supporting structure 12 as a single-port device instead of as the dual-port device illustrated in FIG. 5. Any or all of the drive connection node 56, the sense connection node 58, and the DC connection node 60 may be left open, may be connected to a DC reference, may be connected to one another, or any combination thereof. The dual-mode longitudinal resonator 26 and the supporting structure 12 as a single-port device may be coupled in parallel or series with other circuitry between another circuit node and a DC reference, such as ground, and may be used as a resonator or filter.

Figure 6:
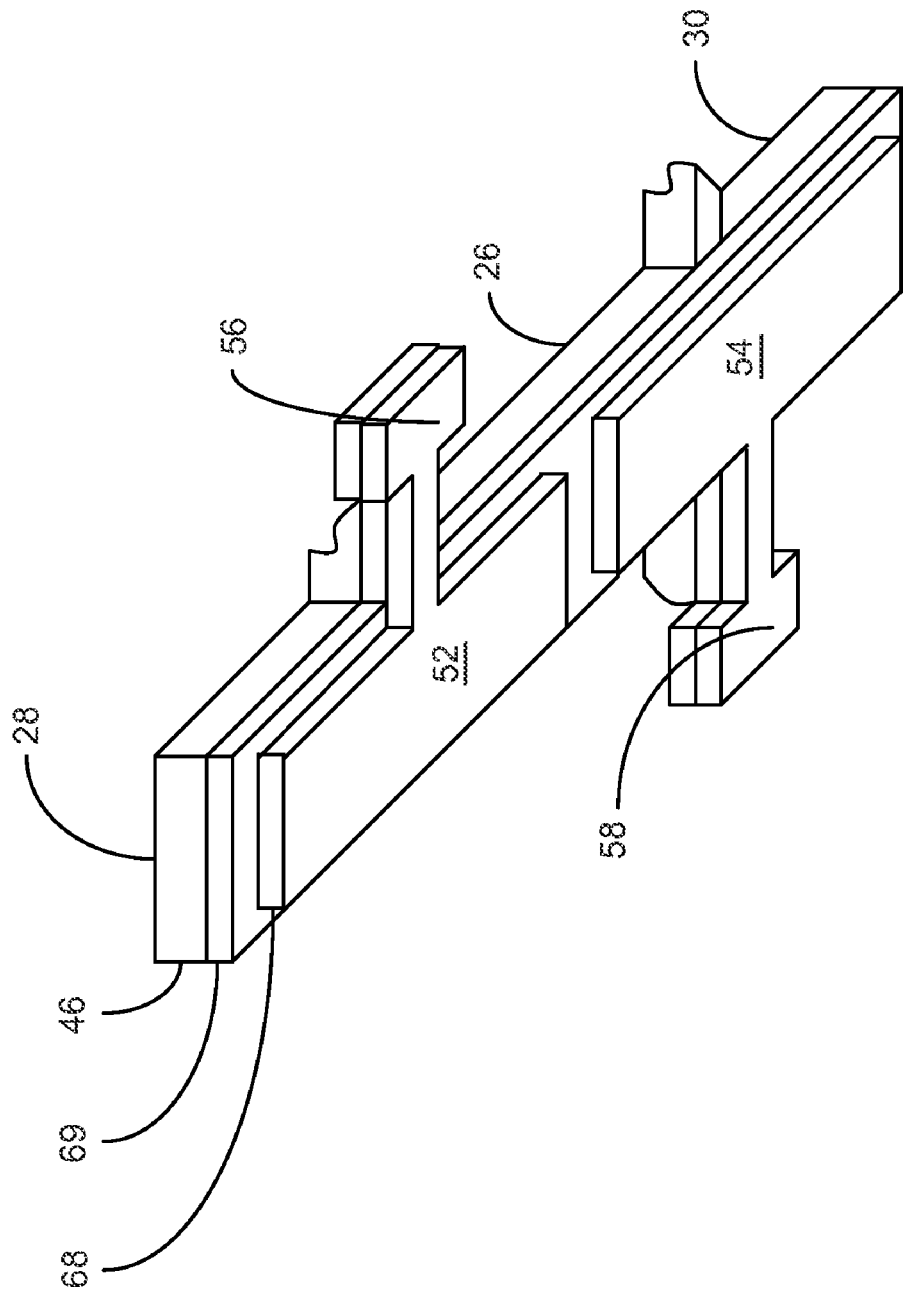
FIG. 6 shows a three-dimensional bottom-view of details of the dual-mode longitudinal resonator, according to an additional embodiment of the present invention.

FIG. 6 shows a three-dimensional bottom-view of details of the dual-mode longitudinal resonator 26, according to an additional embodiment of the present invention. Instead of being provided by the first conducting layer 50, the first conducting area 52, the second conducting area 54, the drive connection node 56, and the sense connection node 58 are provided by a second conducting layer 68. A third insulating layer 69 is over the second conducting layer 68 and the resonating device layer 46 is over the third insulating layer 69. The third insulating layer 69 may electrically insulate the first conducting area 52 and the second conducting area 54 from the resonating device layer 46. In other embodiments of the present invention, resonating elements may include the resonating device layer 46, the first conducting layer 50, the second conducting layer 68, the second insulating layer 48, the third insulating layer 69, or any combination thereof.

Figure 7:
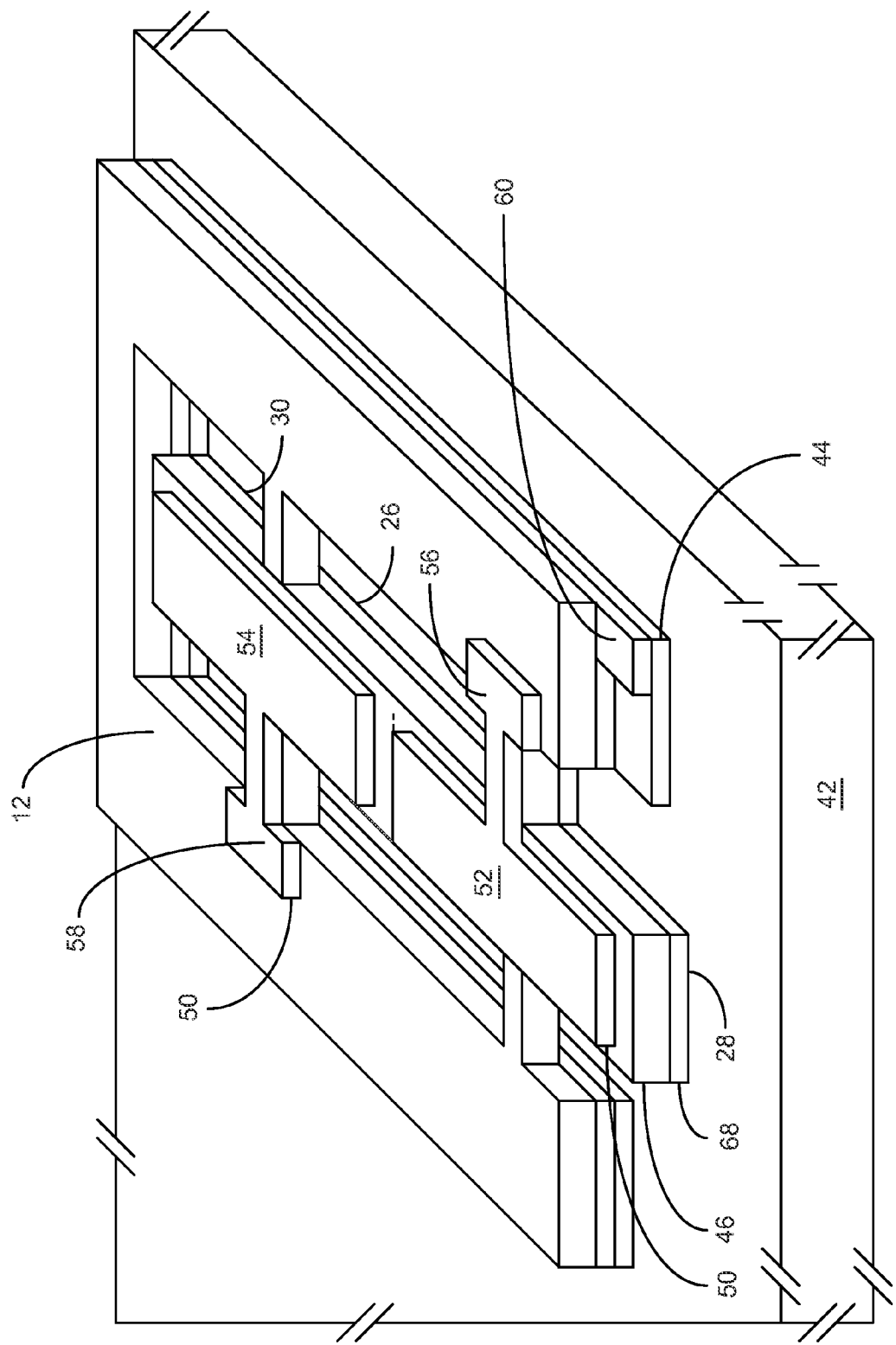
FIG. 7 shows a three-dimensional top-view of details of the dual-mode longitudinal resonator and the supporting structure illustrated in FIG. 2, according to another embodiment of the present invention.

FIG. 7 shows a three-dimensional top-view of details of the dual-mode longitudinal resonator 26 and the supporting structure 12 illustrated in FIG. 2, according to another embodiment of the present invention. The dual-mode longitudinal resonator 26 and the supporting structure 12 are provided by the substrate 42, the first insulating layer 44 over the substrate 42, the second conducting layer 68 over the first insulating layer 44, the resonating device layer 46 over the second conducting layer 68, and the first conducting layer 50 over the resonating device layer 46. The substrate 42, the first insulating layer 44, the second conducting layer 68, and the resonating device layer 46 provide the supporting structure 12, and the second conducting layer 68, the resonating device layer 46, and the first conducting layer 50 provide the dual-mode longitudinal resonator 26, which is free to resonate since it does not include the first insulating layer 44, and is mechanically constrained only by the anchors 14 (FIG. 2).

The first conducting layer 50 provides the first conducting area 52 over the first resonating segment 28 and the second conducting area 54 over the second resonating segment 30. The resonating device layer 46 may include a piezoelectric material, which may electrically insulate the first conducting area 52 from the second conducting layer 68. Therefore, the first conducting area 52, the second conducting layer 68, and the resonating device layer 46 may form a first piezoelectric transducer, which is associated with the first resonating segment 28 to form a first piezoelectric resonating element. The first conducting area 52 and the second conducting layer 68 may form the conductive plates of the first piezoelectric transducer, and the resonating device layer 46 may provide the piezoelectric material of the first piezoelectric transducer. Similarly, the resonating device layer 46 may electrically insulate the second conducting area 54 from the second conducting layer 68. Therefore, the second conducting area 54, the second conducting layer 68, and the resonating device layer 46 may form a second piezoelectric transducer, which is associated with the second resonating segment 30 to form a second piezoelectric resonating element. The second conducting area 54 and the second conducting layer 68 may form the conductive plates of the second piezoelectric transducer, and the resonating device layer 46 may provide the piezoelectric material of the second piezoelectric transducer.

The first conducting layer 50 may provide the drive connection node 56 that is attached to the supporting structure 12, is electrically isolated from the second conducting layer 68 and the second conducting area 54, and is electrically coupled to the first conducting area 52. The first conducting layer 50 may provide the sense connection node 58 that is attached to the supporting structure 12, is electrically isolated from the second conducting layer 68 and the first conducting area 52, and is electrically coupled to the second conducting area 54. The DC connection node 60 may provide an electrical connection to the second conducting layer 68 at the supporting structure 12. The resonating device layer 46 may dominate the resonant characteristics of the first resonating segment 28, the second resonating segment 30, or both. The first conducting layer 50 may be a metallization layer, which may include Aluminum. The second conducting layer 68 may be a metallization layer, which may include Aluminum. The resonating device layer 46 may be a piezoelectric layer, which may include Zinc Oxide, Lead Zirconate Titanate (PZT), Aluminum Nitride (AlN), Lithium Tantalate (LT), or Lithium Niobate (LN).

Figure 8:
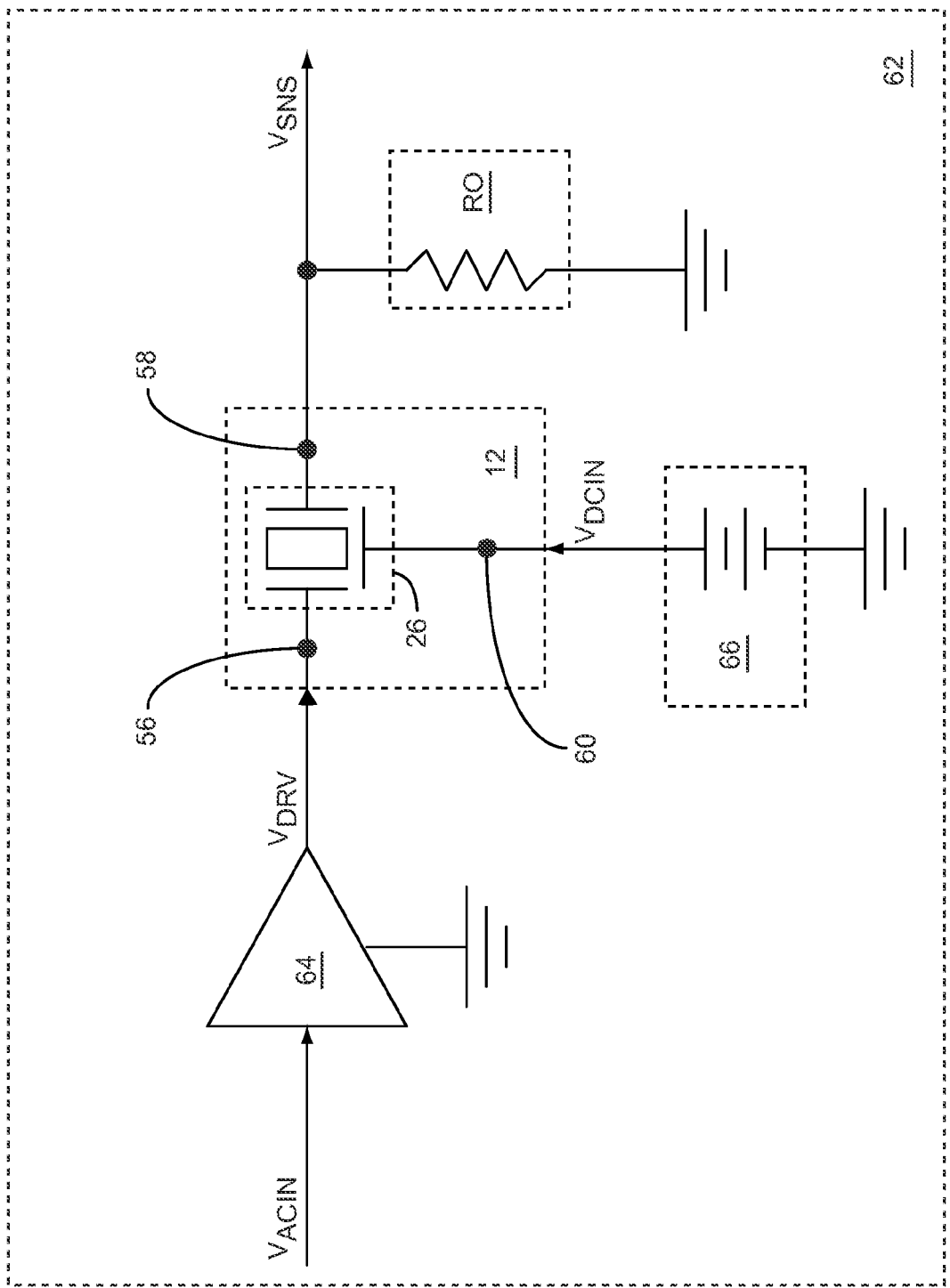
FIG. 8 shows a second resonator circuit, which includes the dual-mode longitudinal resonator and the supporting structure illustrated in FIG. 7, according to another embodiment of the present invention.

FIG. 8 shows the first resonator circuit 62, which includes the dual-mode longitudinal resonator 26 and the supporting structure 12 illustrated in FIG. 7, according to another embodiment of the present invention. The AC driver 64 receives and buffers the AC input signal $V_{ACIN}$ to provide the AC drive signal $V_{DRV}$ to the drive connection node 56. The sense connection node 58 provides the sense signal $V_{SNS}$, which is based on the AC drive signal $V_{DRV}$ and resonance characteristics of the dual-mode longitudinal resonator 26. In an exemplary embodiment of the present invention, an output resistive element RO is coupled between the sense connection node 58 and ground. In a first embodiment of the present invention, the DC power supply 66 may provide the DC input signal $V_{DCIN}$ to the DC connection node 60. The DC input signal $V_{DCIN}$ may provide a DC bias to the first and second piezoelectric resonating elements for proper resonator operation. In a second embodiment of the present invention, the DC power supply 66 is omitted and the DC connection node 60 is coupled directly to ground (not shown).

Since the AC drive signal $V_{DRV}$ is fed to the first conducting area 52 via the drive connection node 56, the first resonating segment 28 is a driven resonating segment. Likewise, since the second conducting area 54 provides the sense signal $V_{SNS}$ via the sense connection node 58, the second resonating segment 30 is a sensed resonating segment. The AC drive signal $V_{DRV}$ may cause vibrations in the first resonating segment 28 that are mechanically coupled to the second resonating segment 30, and generate the sense signal $V_{SNS}$ based on the resonance characteristics of the dual-mode longitudinal resonator 26.

Figure 9:
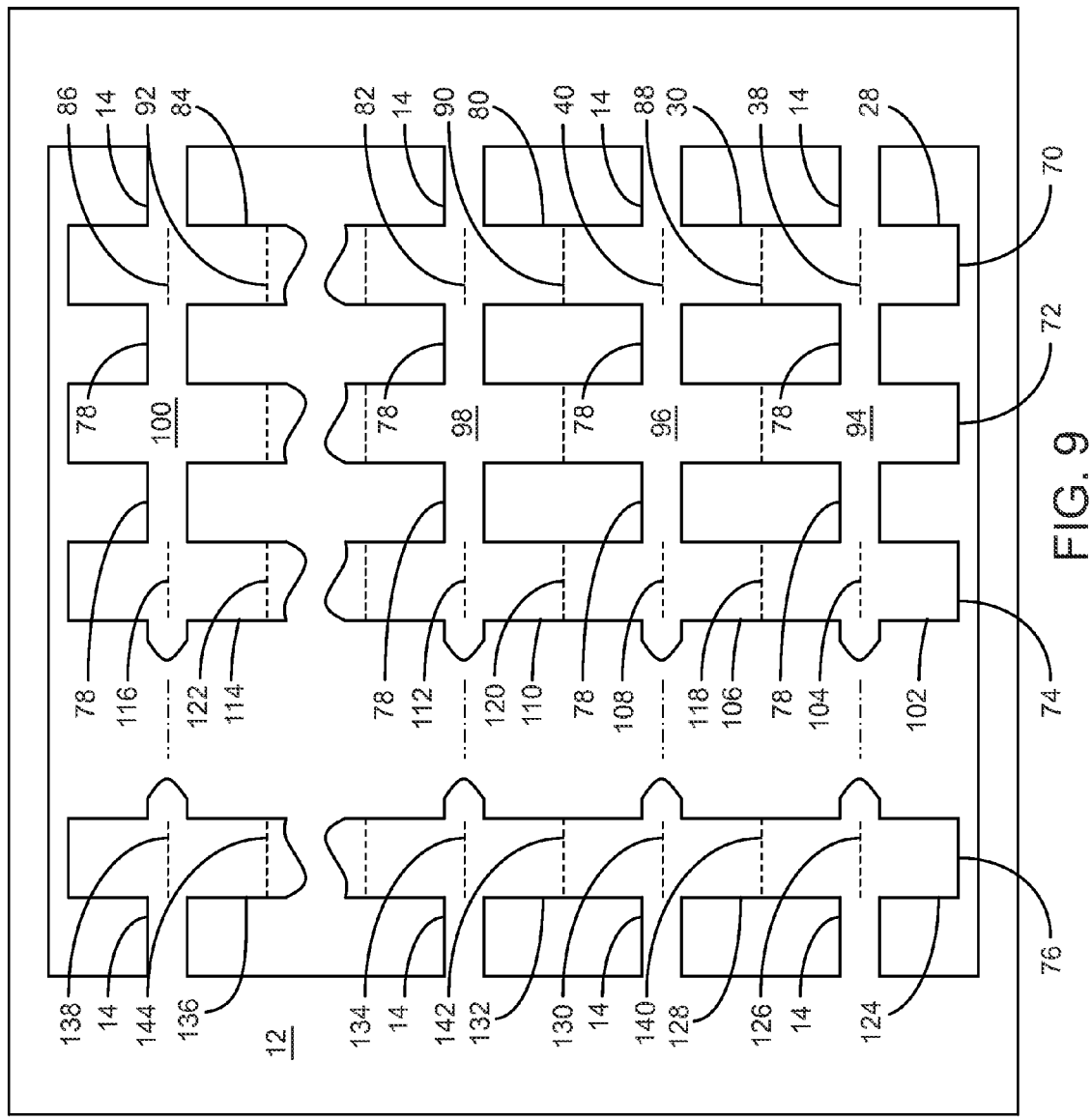
FIG. 9 shows a two-dimensional top-view of an array of multi-mode longitudinally resonating bodies coupled in parallel, according to one embodiment of the present invention.

FIG. 9 shows a two-dimensional top-view of an array of multi-mode longitudinally resonating bodies coupled in parallel, according to one embodiment of the present invention. The array may include a first multi-mode longitudinally resonating body 70, a second multi-mode longitudinally resonating body 72, a third multi-mode longitudinally resonating body 74, up to and including an Mth multi-mode longitudinally resonating body 76. The multi-mode longitudinally resonating bodies 70, 72, 74, 76 may form a resonating structure, which is suspended by the anchors 14 from the supporting structure 12. Each of the multi-mode longitudinally resonating bodies 70, 72, 74, 76 may be an N-mode longitudinally resonating body, which includes N longitudinally resonating segments. The multi-mode longitudinally resonating bodies 70, 72, 74, 76 may be coupled to one another with intra-array couplers 78 at the null axis of each resonating segment. The outside two multi-mode longitudinally resonating bodies 70, 76 may be suspended by the anchors 14 from the supporting structure 12 at the null axis of each resonating segment of the outside two multi-mode longitudinally resonating bodies 70, 76.

The first multi-mode longitudinally resonating body 70 may include the first resonating segment 28, which may resonate about the first null axis 38; the second resonating segment 30, which may resonate about the second null axis 40; a third resonating segment 80, which may resonate about a third null axis 82; up to an including an Nth resonating segment 84, which may resonate about an Nth null axis 86. The first resonating segment 28 and the second resonating segment 30 are adjacent to each other and may meet at a first mode dividing line 88, the second resonating segment 30 and the third resonating segment 80 are adjacent to each other and may meet at a second mode dividing line 90, other resonating segments may be adjacent to each other up to and including an N-1th resonating segment and the Nth resonating segment 84, which are adjacent to each other may meet at an N-1 mode dividing line 92.

The second multi-mode longitudinally resonating body 72 may include a second body first resonating segment 94, which may resonate about a second body first null axis (not shown); a second body second resonating segment 96, which may resonate about a second body second null axis (not shown); a second body third resonating segment 98, which may resonate about a second body third null axis (not shown); up to an including a second body Nth resonating segment 100, which may resonate about a second body Nth null axis (not shown).

The third multi-mode longitudinally resonating body 74 may include a third body first resonating segment 102, which may resonate about a third body first null axis 104; a third body second resonating segment 106, which may resonate about a third body second null axis 108; a third body third resonating segment 110, which may resonate about a third body third null axis 112; up to an including a third body Nth resonating segment 114, which may resonate about a third body Nth null axis 116. The third body first resonating segment 102 and the third body second resonating segment 106 are adjacent to each other and may meet at a third body first mode dividing line 118, the third body second resonating segment 106 and the third body third resonating segment 110 are adjacent to each other and may meet at a third body second mode dividing line 120, other resonating segments may be adjacent to each other up to and including a third body N-1th resonating segment and the third body Nth resonating segment 114, which are adjacent to each other and may meet at a third body N-1 mode dividing line 122.

The Mth multi-mode longitudinally resonating body 76 may include an Mth body first resonating segment 124, which may resonate about an Mth body first null axis 126; an Mth body second resonating segment 128, which may resonate about an Mth body second null axis 130; an Mth body third resonating segment 132, which may resonate about an Mth body third null axis 134; up to and including an Mth body Nth resonating segment 136, which may resonate about an Mth body Nth null axis 138. The Mth body first resonating segment 124 and the Mth body second resonating segment 128 are adjacent to each other and may meet at an Mth body first mode dividing line 140, the Mth body second resonating segment 128 and the Mth body third resonating segment 132 are adjacent to each other and may meet at an Mth body second mode dividing line 142, other resonating segments may be adjacent to each other up to and including an Mth body N-1th resonating segment and the Mth body Nth resonating segment 136, which are adjacent to each other and may meet at an Mth body N-1 mode dividing line 144.

In a first embodiment of the present invention, the first multi-mode longitudinally resonating body 70 is a dual-mode longitudinally resonating body, which includes the first resonating segment 28 and the second resonating segment 30. In a second embodiment of the present invention, the first multi-mode longitudinally resonating body 70 is a triple-mode longitudinally resonating body, which includes the first resonating segment 28, the second resonating segment 30, and the third resonating segment 80. In a third embodiment of the present invention, the first multi-mode longitudinally resonating body 70 is a quadruple-mode longitudinally resonating body, which includes the first resonating segment 28, the second resonating segment 30, the third resonating segment 80, and the Nth resonating segment 84, which is a fourth resonating segment.

In a fourth embodiment of the present invention, the first multi-mode longitudinally resonating body 70 is a quintuple-mode longitudinally resonating body, which includes the first resonating segment 28, the second resonating segment 30, the third resonating segment 80, a fourth resonating segment (not shown), and the Nth resonating segment 84, which is a fifth resonating segment. In a fifth embodiment of the present invention, the first multi-mode longitudinally resonating body 70 is a sextuple-mode longitudinally resonating body, which includes the first resonating segment 28, the second resonating segment 30, the third resonating segment 80, a fourth resonating segment (not shown), a fifth resonating segment (not shown), and the Nth resonating segment 84, which is a sixth resonating segment. In a sixth embodiment of the present invention, the first multi-mode longitudinally resonating body 70 is a septuple-mode longitudinally resonating body, which includes the first resonating segment 28, the second resonating segment 30, the third resonating segment 80, a fourth resonating segment (not shown), a fifth resonating segment (not shown), a sixth resonating segment (not shown), and the Nth resonating segment 84, which is a seventh resonating segment.

In an seventh embodiment of the present invention, the first multi-mode longitudinally resonating body 70 is an octuple-mode longitudinally resonating body, which includes the first resonating segment 28, the second resonating segment 30, the third resonating segment 80, a fourth resonating segment (not shown), a fifth resonating segment (not shown), a sixth resonating segment (not shown), a seventh resonating segment (not shown), and the Nth resonating segment 84, which is an eighth resonating segment. In an eighth embodiment of the present invention, the first multi-mode longitudinally resonating body 70 is a nonuple-mode longitudinally resonating body, which includes the first resonating segment 28, the second resonating segment 30, the third resonating segment 80, a fourth resonating segment (not shown), a fifth resonating segment (not shown), a sixth resonating segment (not shown), a seventh resonating segment (not shown), an eighth resonating segment (not shown), and the Nth resonating segment 84, which is a ninth resonating segment. In a ninth embodiment of the present invention, the first multi-mode longitudinally resonating body 70 is a decuple-mode longitudinally resonating body, which includes the first resonating segment 28, the second resonating segment 30, the third resonating segment 80, a fourth resonating segment (not shown), a fifth resonating segment (not shown), a sixth resonating segment (not shown), a seventh resonating segment (not shown), an eighth resonating segment (not shown), a ninth resonating segment (not shown), and the Nth resonating segment 84, which is a tenth resonating segment.

In a tenth embodiment of the present invention, the resonating structure includes the first multi-mode longitudinally resonating body 70 and the second multi-mode longitudinally resonating body 72. In an eleventh embodiment of the present invention, the resonating structure includes the first multi-mode longitudinally resonating body 70, the second multi-mode longitudinally resonating body 72, and the third multi-mode longitudinally resonating body 74. In a twelfth embodiment of the present invention, the resonating structure includes the first multi-mode longitudinally resonating body 70, the second multi-mode longitudinally resonating body 72, the third multi-mode longitudinally resonating body 74, and the Mth multi-mode longitudinally resonating body 76, which is a fourth multi-mode longitudinally resonating body.

In a thirteenth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), and the Mth multi-mode longitudinally resonating body 76, which is a fifth multi-mode longitudinally resonating body. In a fourteenth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), and the Mth multi-mode longitudinally resonating body 76, which is a sixth multi-mode longitudinally resonating body. In a fifteenth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), and the Mth multi-mode longitudinally resonating body 76, which is a seventh multi-mode longitudinally resonating body.

In a sixteenth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), and the Mth multi-mode longitudinally resonating body 76, which is an eighth multi-mode longitudinally resonating body. In a seventeenth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), an eighth multi-mode longitudinally resonating body (not shown), and the Mth multi-mode longitudinally resonating body 76, which is a ninth multi-mode longitudinally resonating body. In an eighteenth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), an eighth multi-mode longitudinally resonating body (not shown), a ninth multi-mode longitudinally resonating body (not shown), and the Mth multi-mode longitudinally resonating body 76, which is a tenth multi-mode longitudinally resonating body.

In a nineteenth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), an eighth multi-mode longitudinally resonating body (not shown), a ninth multi-mode longitudinally resonating body (not shown), a tenth multi-mode longitudinally resonating body (not shown), and the Mth multi-mode longitudinally resonating body 76, which is an eleventh multi-mode longitudinally resonating body. In a twentieth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), an eighth multi-mode longitudinally resonating body (not shown), a ninth multi-mode longitudinally resonating body (not shown), a tenth multi-mode longitudinally resonating body (not shown), an eleventh multi-mode longitudinally resonating body (not shown), and the Mth multi-mode longitudinally resonating body 76, which is a twelfth multi-mode longitudinally resonating body.

In a twenty-first embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), an eighth multi-mode longitudinally resonating body (not shown), a ninth multi-mode longitudinally resonating body (not shown), a tenth multi-mode longitudinally resonating body (not shown), an eleventh multi-mode longitudinally resonating body (not shown), a twelfth multi-mode longitudinally resonating body (not shown, and the Mth multi-mode longitudinally resonating body 76, which is a thirteenth multi-mode longitudinally resonating body. In a twenty-second embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), an eighth multi-mode longitudinally resonating body (not shown), a ninth multi-mode longitudinally resonating body (not shown), a tenth multi-mode longitudinally resonating body (not shown), an eleventh multi-mode longitudinally resonating body (not shown), a twelfth multi-mode longitudinally resonating body (not shown), a thirteenth multi-mode longitudinally resonating body (not shown), and the Mth multi-mode longitudinally resonating body 76, which is a fourteenth multi-mode longitudinally resonating body.

In a twenty-third embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), an eighth multi-mode longitudinally resonating body (not shown), a ninth multi-mode longitudinally resonating body (not shown), a tenth multi-mode longitudinally resonating body (not shown), an eleventh multi-mode longitudinally resonating body (not shown), a twelfth multi-mode longitudinally resonating body (not shown), a thirteenth multi-mode longitudinally resonating body (not shown), a fourteenth multi-mode longitudinally resonating body (not shown), and the Mth multi-mode longitudinally resonating body 76, which is a fifteenth multi-mode longitudinally resonating body.

In a twenty-fourth embodiment of the present invention, the resonating structure includes the first multi-mode longitudinally resonating body 70, the second multi-mode longitudinally resonating body 72, the third multi-mode longitudinally resonating body 74, a fourth multi-mode longitudinally resonating body (not shown), a fifth multi-mode longitudinally resonating body (not shown), a sixth multi-mode longitudinally resonating body (not shown), a seventh multi-mode longitudinally resonating body (not shown), an eighth multi-mode longitudinally resonating body (not shown), a ninth multi-mode longitudinally resonating body (not shown), a tenth multi-mode longitudinally resonating body (not shown), an eleventh multi-mode longitudinally resonating body (not shown), a twelfth multi-mode longitudinally resonating body (not shown), a thirteenth multi-mode longitudinally resonating body (not shown), a fourteenth multi-mode longitudinally resonating body (not shown), a fifteenth multi-mode longitudinally resonating body (not shown), and the Mth multi-mode longitudinally resonating body 76, which is a sixteenth multi-mode longitudinally resonating body.

Figure 10:
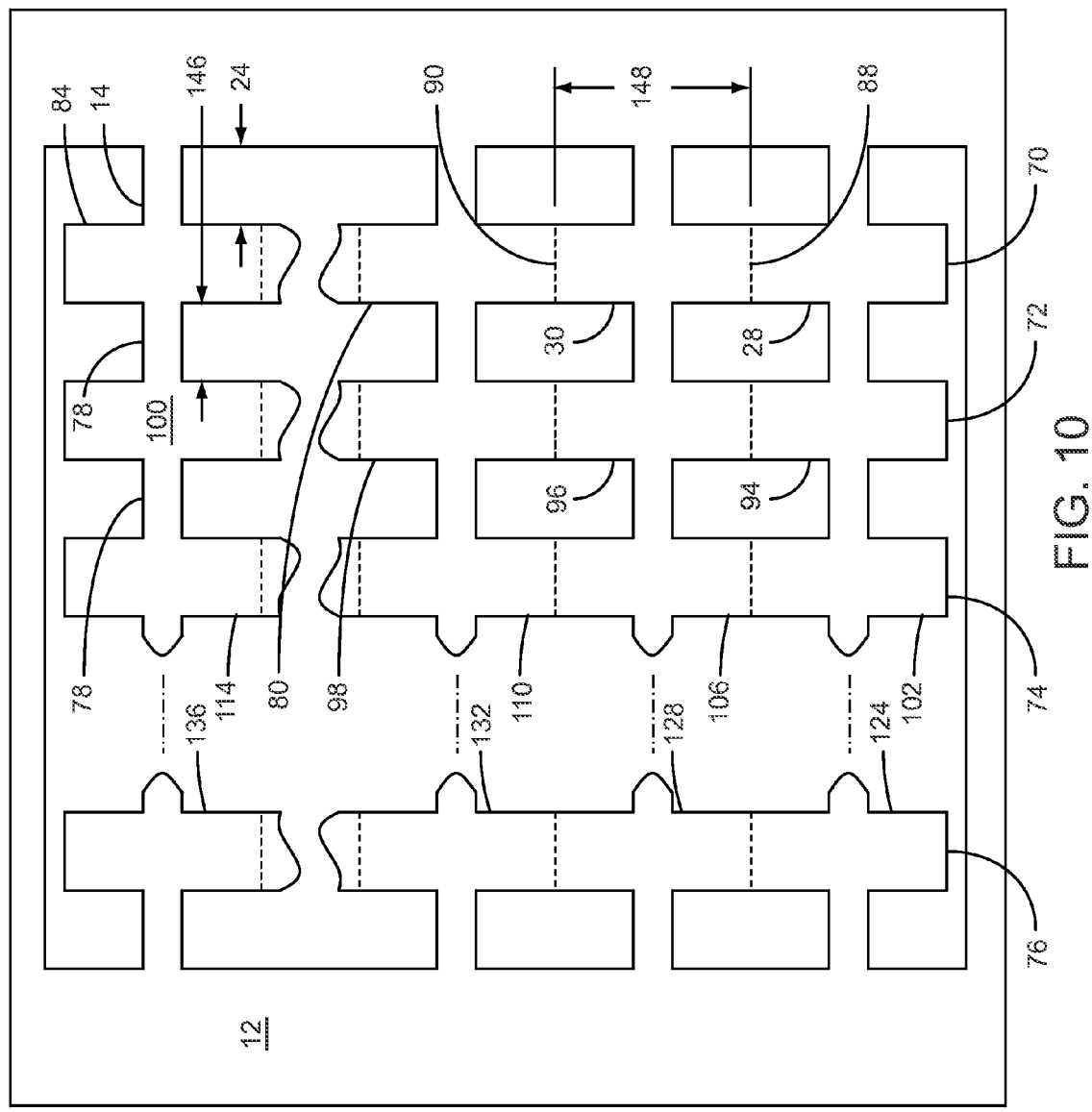
FIG. 10 shows a two-dimensional top-view of details of the array of multi-mode longitudinally resonating bodies illustrated in FIG. 9.

FIG. 10 shows a two-dimensional top-view of details of the array of multi-mode longitudinally resonating bodies illustrated in FIG. 9. Each of the anchors 14 has the anchor length 24, which may be about equal to the distance between the first multi-mode longitudinally resonating body 70 and the supporting structure 12, or the distance between the Mth multi-mode longitudinally resonating body 76 and the supporting structure 12. Each of the intra-array couplers 78 has an intra-array coupler length 146, which may be about equal to the distance between any adjacent two of the multi-mode longitudinally resonating bodies 70, 72, 74, 76.

To maximize the quality factor of the resonating structure, the anchor length 24 may be about equal to one-quarter of a wavelength of a resonant frequency of at least one of the multi-mode longitudinally resonating bodies 70, 72, 74, 76, the intra-array coupler length 146 may be about equal to one-half of the wavelength of the resonant frequency of at least one of the multi-mode longitudinally resonating bodies 70, 72, 74, 76, or both. Each of the resonating segments 28, 30, 80, 84, 94, 96, 98, 100, 102, 106, 110, 114, 124, 128, 132, 136 may have a multi-mode resonating length 148. To vibrate, or operate, at the desired resonant frequency, the multi-mode resonating length 148 may be about equal to one-half of the wavelength of the resonant frequency of at least one of the multi-mode longitudinally resonating bodies 70, 72, 74, 76.

Figure 11:
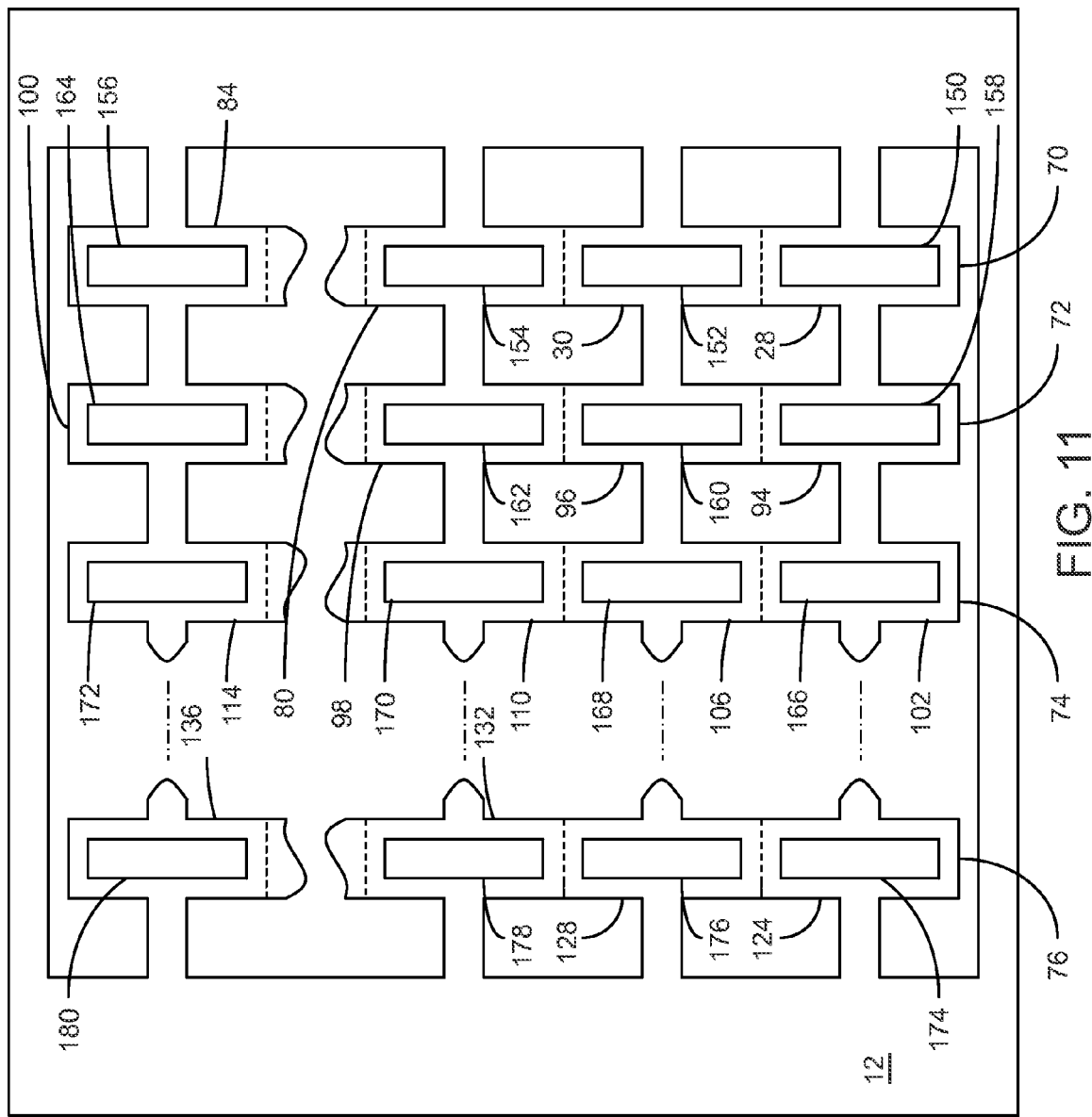
FIG. 11 shows a two-dimensional top-view of additional details of the array of multi-mode longitudinally resonating bodies illustrated in FIG. 9.

FIG. 11 shows a two-dimensional top-view of additional details of the array of multi-mode longitudinally resonating bodies illustrated in FIG. 9. The first multi-mode longitudinally resonating body 70 may include a first conducting area 150 over the first resonating segment 28, a second conducting area 152 over the second resonating segment 30, a third conducting area 154 over the third resonating segment 80, up to and including an Nth conducting area 156 over the Nth resonating segment 84.

The second multi-mode longitudinally resonating body 72 may include a second body first conducting area 158 over the second body first resonating segment 94, a second body second conducting area 160 over the second body second resonating segment 96, a second body third conducting area 162 over the second body third resonating segment 98, up to and including a second body Nth conducting area 164 over the second body Nth resonating segment 100.

The third multi-mode longitudinally resonating body 74 may include a third body first conducting area 166 over the third body first resonating segment 102, a third body second conducting area 168 over the third body second resonating segment 106, a third body third conducting area 170 over the third body third resonating segment 110, up to and including a third body Nth conducting area 172 over the third body Nth resonating segment 114.

The Mth multi-mode longitudinally resonating body 76 may include an Mth body first conducting area 174 over the Mth body first resonating segment 124, an Mth body second conducting area 176 over the Mth body second resonating segment 128, an Mth body third conducting area 178 over the Mth body third resonating segment 132, up to and including an Mth body Nth conducting area 180 over the Mth body Nth resonating segment 136.

In alternate embodiments of the present invention, any or all of the conducting areas 150, 152, 154, 156, 158, 160, 162, 164, 166, 168, 170, 172, 174, 176, 178, 180 may be omitted. Any or all of the conducting areas 150, 152, 154, 156, 158, 160, 162, 164, 166, 168, 170, 172, 174, 176, 178, 180 may be located under their respective resonating segments 28, 30, 80, 84, 94, 96, 98, 100, 102, 106, 110, 114, 124, 128, 132, 136 instead of being located over their respective resonating segments 28, 30, 80, 84, 94, 96, 98, 100, 102, 106, 110, 114, 124, 128, 132, 136 as illustrated in FIG. 11.

FIG. 12 shows a two-dimensional top-view of the array of multi-mode longitudinally resonating bodies illustrated in FIG. 11, according to a first embodiment of the resonating structure. The resonating structure includes an odd number of multi-mode longitudinally resonating bodies 70, 72, 74, 76; therefore, M is an odd number. Each of the multi-mode longitudinally resonating bodies 70, 72, 74, 76 is an N-mode longitudinally resonating body, wherein N is an odd number. Therefore, each of the multi-mode longitudinally resonating bodies 70, 72, 74, 76 includes an odd number, namely N, of longitudinally resonating segments.

The odd conducting areas 150, 154, 156, 158, 162, 164, 166, 170, 172, 174, 178, 180 are electrically coupled to the drive connection node 56; therefore, the corresponding odd resonating segments 28, 80, 84, 94, 98, 100, 102, 110, 114, 124, 132, 136 are driven resonating segments. Similarly, the even conducting areas 152, 160, 168, 176 are electrically coupled to the sense connection node 58; therefore, the corresponding even resonating segments 30, 96, 106, 128 are sensed resonating segments.

Any two adjacent resonating segments in any of the multi-mode longitudinally resonating bodies 70, 72, 74, 76 may resonate at about the same resonant frequency with about a 180 degree phase-shift with respect to one another. Any two adjacent resonating segments in any of the multi-mode longitudinally resonating bodies 70, 72, 74, 76 are such that one of the two adjacent resonating segments is a driven resonating segment and the other of the two adjacent resonating segments is a sensed resonating segment. Any two resonating segments, such that one of the two resonating segments is in any of the multi-mode longitudinally resonating bodies 70, 72, 74, 76 and is coupled via an intra-array coupler 78 to the other of the two resonating segments in an adjacent multi-mode longitudinally resonating body 70, 72, 74, 76, are both either driven resonating segments or sensed resonating segments.

In an alternate embodiment of the present invention, the resonating structure may include an even number of multi-mode longitudinally resonating bodies 70, 72, 74, 76 such that M is an even number, or each of the multi-mode longitudinally resonating bodies 70, 72, 74, 76 includes an even number, namely N, of longitudinally resonating segments. In another embodiment of the present invention, instead of the odd conducting areas 150, 154, 156, 158, 162, 164, 166, 170, 172, 174, 178, 180 being electrically coupled to the drive connection node 56 and the even conducting areas 152, 160, 168, 176 being electrically coupled to the sense connection node 58, the odd conducting areas 150, 154, 156, 158, 162, 164, 166, 170, 172, 174, 178, 180 are electrically coupled to the sense connection node 58 and the even conducting areas 152, 160, 168, 176 are electrically coupled to the drive connection node 56.

FIG. 13 shows a two-dimensional top-view of the array of multi-mode longitudinally resonating bodies illustrated in FIG. 11, according to a second embodiment of the resonating structure. The resonating structure includes an even number of multi-mode longitudinally resonating bodies 70, 72, 74, 76; therefore, M is an even number. Each of the multi-mode longitudinally resonating bodies 70, 72, 74, 76 is an N-mode longitudinally resonating body, wherein N is an even number. Therefore, each of the multi-mode longitudinally resonating bodies 70, 72, 74, 76 includes an even number, namely N, of longitudinally resonating segments.

The odd conducting areas 150, 154, 158, 162, 166, 170, 174, 178 are electrically coupled to the drive connection node 56; therefore, the corresponding odd resonating segments 28, 80, 94, 98, 102, 110, 124, 132 are driven resonating segments. Similarly, the even conducting areas 152, 156, 160, 164, 168, 172, 176, 180 are electrically coupled to the sense connection node 58; therefore, the corresponding even resonating segments 30, 84, 96, 100, 106, 114, 128, 136 are sensed resonating segments.

Any two adjacent resonating segments in any of the multi-mode longitudinally resonating bodies 70, 72, 74, 76 may resonate at about the same resonant frequency with about a 180 degree phase-shift with respect to one another. Any two adjacent resonating segments in any of the multi-mode longitudinally resonating bodies 70, 72, 74, 76 are such that one of the two adjacent resonating segments is a driven resonating segment and the other of the two adjacent resonating segments is a sensed resonating segment. Any two resonating segments, such that one of the two resonating segments is in any of the multi-mode longitudinally resonating bodies 70, 72, 74, 76 and is coupled via an intra-array coupler 78 to the other of the two resonating segments in an adjacent multi-mode longitudinally resonating body 70, 72, 74, 76, are both either driven resonating segments or sensed resonating segments.

In another embodiment of the present invention, instead of the odd conducting areas 150, 154, 158, 162, 166, 170, 174, 178 being electrically coupled to the drive connection node 56 and the even conducting areas 152, 156, 160, 164, 168, 172, 176, 180 being electrically coupled to the sense connection node 58, the odd conducting areas 150, 154, 158, 162, 166, 170, 174, 178 are electrically coupled to the sense connection node 58 and the even conducting areas 152, 156, 160, 164, 168, 172, 176, 180 are electrically coupled to the drive connection node 56.

Figure 14:
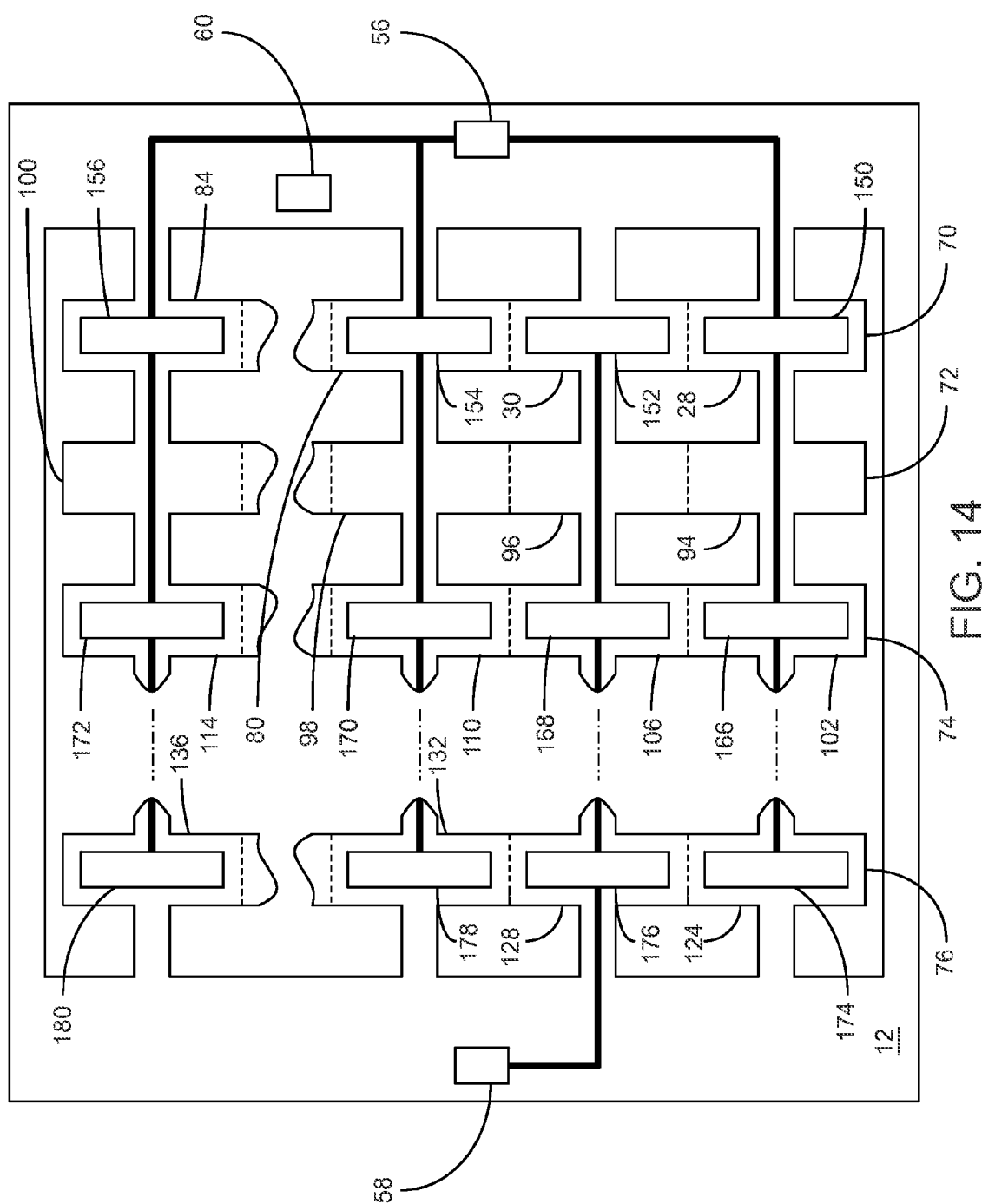
FIG. 14 shows a two-dimensional top-view of the array of multi-mode longitudinally resonating bodies illustrated in FIG. 11, according to a third embodiment of the resonating structure.

FIG. 14 shows a two-dimensional top-view of the array of multi-mode longitudinally resonating bodies illustrated in FIG. 11, according to a third embodiment of the resonating structure. The resonating structure includes an odd number of multi-mode longitudinally resonating bodies 70, 72, 74, 76; therefore, M is an odd number. Each of the multi-mode longitudinally resonating bodies 70, 72, 74, 76 is an N-mode longitudinally resonating body, wherein N is an odd number. Therefore, each of the multi-mode longitudinally resonating bodies 70, 72, 74, 76 includes an odd number, namely N, of longitudinally resonating segments.

The odd conducting areas 150, 154, 156, 166, 170, 172, 174, 178, 180 of the odd multi-mode longitudinally resonating bodies 70, 74, 76 are electrically coupled to the drive connection node 56; therefore, the corresponding odd resonating segments 28, 80, 84, 102, 110, 114, 124, 132, 136 are driven resonating segments. Similarly, the even conducting areas 152, 168, 176 of the odd multi-mode longitudinally resonating bodies 70, 74, 76 are electrically coupled to the sense connection node 58; therefore, the corresponding even resonating segments 30, 106, 128 are sensed resonating segments. The conducting areas 158, 160, 162, 164 of the even multi-mode longitudinally resonating body(s) 72 are omitted.

Any two adjacent resonating segments in any of the multi-mode longitudinally resonating bodies 70, 72, 74, 76 may resonate at about the same resonant frequency with about a 180 degree phase-shift with respect to one another. Any two adjacent resonating segments in any of the multi-mode longitudinally resonating bodies 70, 72, 74, 76 are such that one of the two adjacent resonating segments is a driven resonating segment and the other of the two adjacent resonating segments is a sensed resonating segment. Any two related resonating segments are either both driven resonating segments or are both sensed resonating segments. Two resonating segments are related if one of the two resonating segments is in any of the odd multi-mode longitudinally resonating bodies 70, 74, 76, if the one of the two resonating segments is coupled via an intra-array coupler 78 to a resonating segment without a conducting area in an adjacent even multi-mode longitudinally resonating body 72, and if the resonating segment without a conducting area is coupled via another intra-array coupler 78 to the other of the two resonating segments in another adjacent odd multi-mode longitudinally resonating body 70, 74, 76.

In an alternate embodiment of the present invention, the resonating structure may include an even number of multi-mode longitudinally resonating bodies 70, 72, 74, 76 such that M is an even number, or each of the multi-mode longitudinally resonating bodies 70, 72, 74, 76 includes an even number, namely N, of longitudinally resonating segments. In another embodiment of the present invention, instead of the odd conducting areas 150, 154, 156, 166, 170, 172, 174, 178, 180 of the odd multi-mode longitudinally resonating bodies 70, 74, 76 being electrically coupled to the drive connection node 56 and the even conducting areas 152, 168, 176 of the odd multi-mode longitudinally resonating bodies 70, 74, 76 being electrically coupled to the sense connection node 58, the odd conducting areas 150, 154, 156, 166, 170, 172, 174, 178, 180 of the odd multi-mode longitudinally resonating bodies 70, 74, 76 are electrically coupled to the sense connection node 58 and the even conducting areas 152, 168, 176 of the odd multi-mode longitudinally resonating bodies 70, 74, 76 are electrically coupled to the drive connection node 56.

Figure 15:
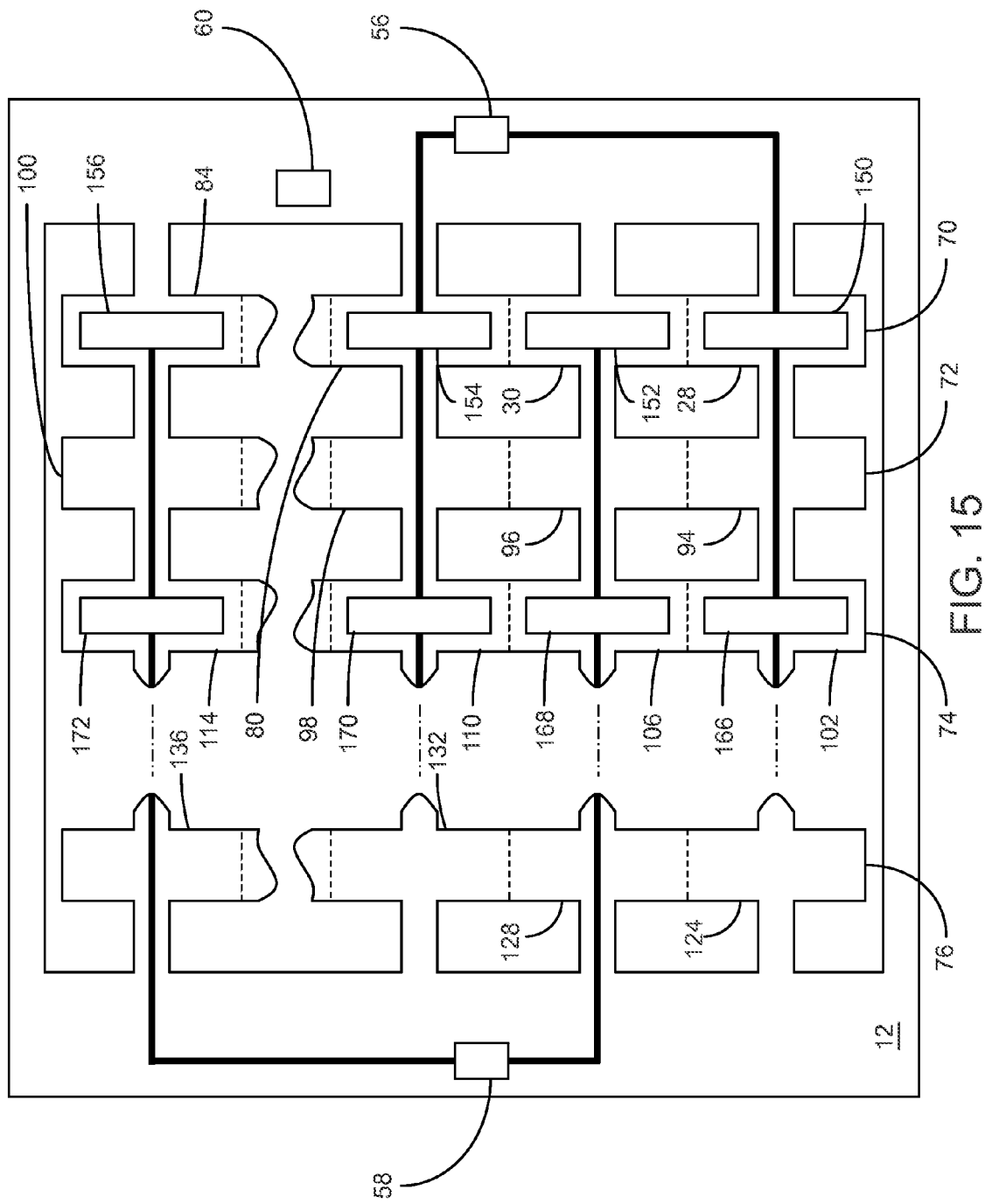
FIG. 15 shows a two-dimensional top-view of the array of multi-mode longitudinally resonating bodies illustrated in FIG. 11, according to a fourth embodiment of the resonating structure.

FIG. 15 shows a two-dimensional top-view of the array of multi-mode longitudinally resonating bodies illustrated in FIG. 11, according to a fourth embodiment of the resonating structure. The resonating structure includes an even number of multi-mode longitudinally resonating bodies 70, 72, 74, 76; therefore, M is an even number. Each of the multi-mode longitudinally resonating bodies 70, 72, 74, 76 is an N-mode longitudinally resonating body, wherein N is an even number. Therefore, each of the multi-mode longitudinally resonating bodies 70, 72, 74, 76 includes an even number, namely N, of longitudinally resonating segments.

The odd conducting areas 150, 154, 166, 170 of the odd multi-mode longitudinally resonating bodies 70, 74 are electrically coupled to the drive connection node 56; therefore, the corresponding odd resonating segments 28, 80, 102, 110 are driven resonating segments. Similarly, the even conducting areas 152, 156, 168, 172 of the odd multi-mode longitudinally resonating bodies 70, 74 are electrically coupled to the sense connection node 58; therefore, the corresponding even resonating segments 30, 84, 106, 114 are sensed resonating segments. The conducting areas 158, 160, 162, 164, 174, 176, 178, 180 of the even multi-mode longitudinally resonating bodies 72, 76 are omitted.

Any two adjacent resonating segments in any of the multi-mode longitudinally resonating bodies 70, 72, 74, 76 may resonate at about the same resonant frequency with about a 180 degree phase-shift with respect to one another. Any two adjacent resonating segments in any of the odd multi-mode longitudinally resonating bodies 70, 74 are such that one of the two adjacent resonating segments is a driven resonating segment and the other of the two adjacent resonating segments is a sensed resonating segment. Any two related resonating segments are both either driven resonating segments or sensed resonating segments. Two resonating segments are related if one of the two resonating segments is in any of the odd multi-mode longitudinally resonating bodies 70, 74, if the one of the two resonating segments is coupled via an intra-array coupler 78 to a resonating segment without a conducting area in an adjacent even multi-mode longitudinally resonating body 72, 76, and if the resonating segment without a conducting area is coupled via another intra-array coupler 78 to the other of the two resonating segments in another adjacent odd multi-mode longitudinally resonating body 70, 74.

In another embodiment of the present invention, instead of the odd conducting areas 150, 154, 166, 170 of the odd multi-mode longitudinally resonating bodies 70, 74 being electrically coupled to the drive connection node 56 and the even conducting areas 152, 156, 168, 172 of the odd multi-mode longitudinally resonating bodies 70, 74 being electrically coupled to the sense connection node 58, the odd conducting areas 150, 154, 166, 170 of the odd multi-mode longitudinally resonating bodies 70, 74 are electrically coupled to the sense connection node 58 and the even conducting areas 152, 156, 168, 172 of the odd multi-mode longitudinally resonating bodies 70, 74 are electrically coupled to the drive connection node 56.

Figure 16:
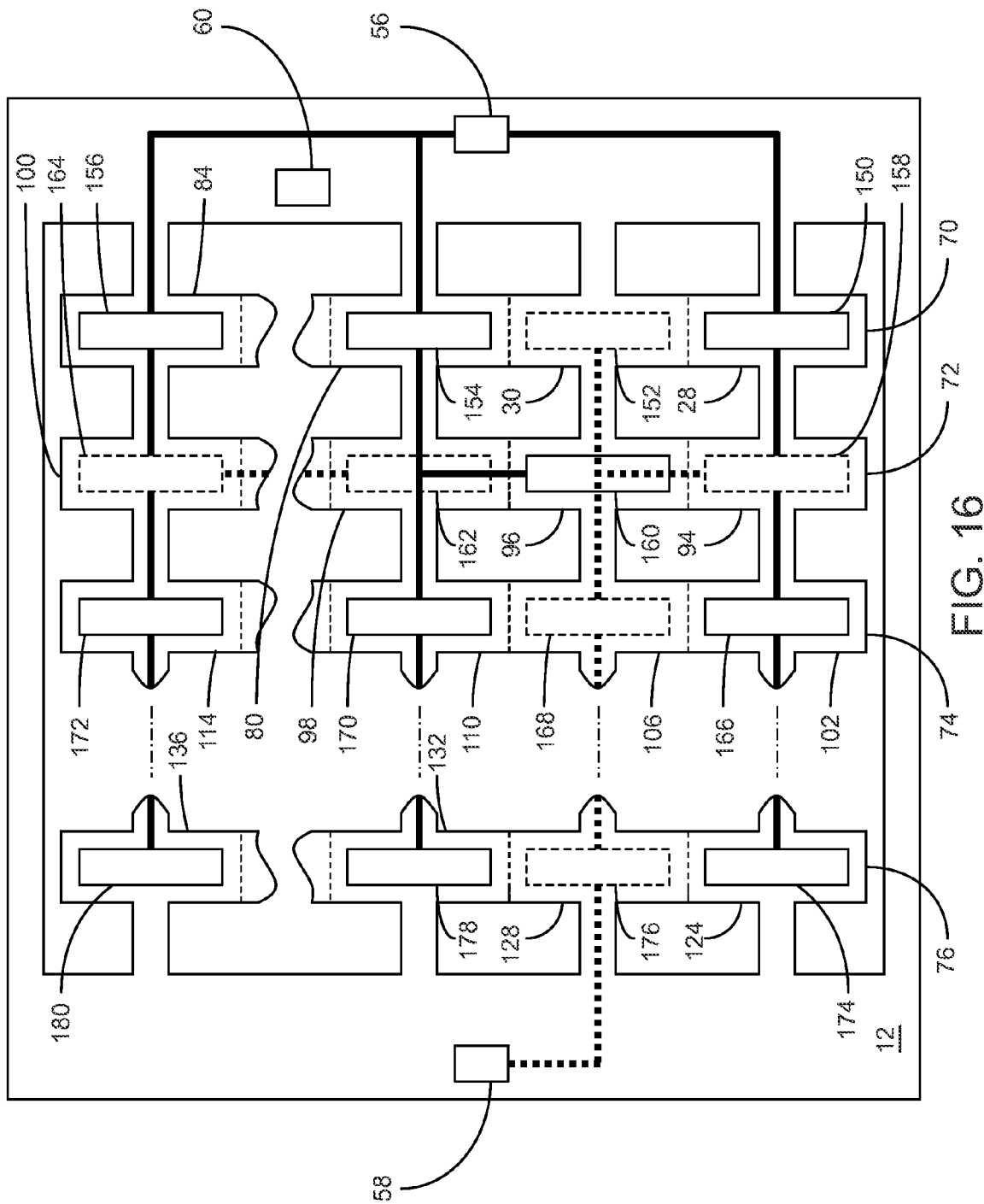
FIG. 16 shows a two-dimensional top-view of the array of multi-mode longitudinally resonating bodies illustrated in FIG. 11, according to a fifth embodiment of the resonating structure.

FIG. 16 shows a two-dimensional top-view of the array of multi-mode longitudinally resonating bodies illustrated in FIG. 11, according to a fifth embodiment of the resonating structure. The resonating structure includes an odd number of multi-mode longitudinally resonating bodies 70, 72, 74, 76; therefore, M is an odd number. Each of the multi-mode longitudinally resonating bodies 70, 72, 74, 76 is an N-mode longitudinally resonating body, wherein N is an odd number. Therefore, each of the multi-mode longitudinally resonating bodies 70, 72, 74, 76 includes an odd number, namely N, of longitudinally resonating segments.

The odd conducting areas 150, 154, 156, 166, 170, 172, 174, 178, 180 of the odd multi-mode longitudinally resonating bodies 70, 74, 76 and the even conducting area 160 of the even multi-mode longitudinally resonating body(s) 72 are electrically coupled to the drive connection node 56; therefore, the corresponding resonating segments 28, 80, 84, 102, 110, 114, 124, 132, 136, 96 are driven resonating segments. Similarly, the even conducting areas 152, 168, 176 of the odd multi-mode longitudinally resonating bodies 70, 74, 76 and the odd conducting areas 158, 162, 164 of the even multi-mode longitudinally resonating body(s) 72 are electrically coupled to the sense connection node 58; therefore, the corresponding resonating segments 30, 106, 128, 94, 98, 100 are sensed resonating segments.

Any two adjacent resonating segments in any of the multi-mode longitudinally resonating bodies 70, 72, 74, 76 may resonate at about the same resonant frequency with about a 180 degree phase-shift with respect to one another. Any two adjacent resonating segments in any of the multi-mode longitudinally resonating bodies 70, 72, 74, 76 are such that one of the two adjacent resonating segments is a driven resonating segment and the other of the two adjacent resonating segments is a sensed resonating segment. Any two resonating segments, such that one of the two resonating segments is in any of the multi-mode longitudinally resonating bodies 70, 72, 74, 76 and is coupled via an intra-array coupler 78 to the other of the two resonating segments in an adjacent multi-mode longitudinally resonating body 70, 72, 74, 76, are such that one of the two resonating segments is a driven resonating segment and the other of the two resonating segments is a sensed resonating segment.

In an alternate embodiment of the present invention, the resonating structure may include an even number of multi-mode longitudinally resonating bodies 70, 72, 74, 76 such that M is an even number, or each of the multi-mode longitudinally resonating bodies 70, 72, 74, 76 includes an even number, namely N, of longitudinally resonating segments. In another embodiment of the present invention, instead of the odd conducting areas 150, 154, 156, 166, 170, 172, 174, 178, 180 of the odd multi-mode longitudinally resonating bodies 70, 74, 76 and the even conducting area 160 of the even multi-mode longitudinally resonating body(s) 72 being electrically coupled to the drive connection node 56 and the even conducting areas 152, 168, 176 of the odd multi-mode longitudinally resonating bodies 70, 74, 76 and the odd conducting areas 158, 162, 164 of the even multi-mode longitudinally resonating body(s) 72 being electrically coupled to the sense connection node 58, the odd conducting areas 150, 154, 156, 166, 170, 172, 174, 178, 180 of the odd multi-mode longitudinally resonating bodies 70, 74, 76 and the even conducting area 160 of the even multi-mode longitudinally resonating body(s) 72 are electrically coupled to the sense connection node 58 and the even conducting areas 152, 168, 176 of the odd multi-mode longitudinally resonating bodies 70, 74, 76 and the odd conducting areas 158, 162, 164 of the even multi-mode longitudinally resonating body(s) 72 are electrically coupled to the drive connection node 56.

Figure 17:
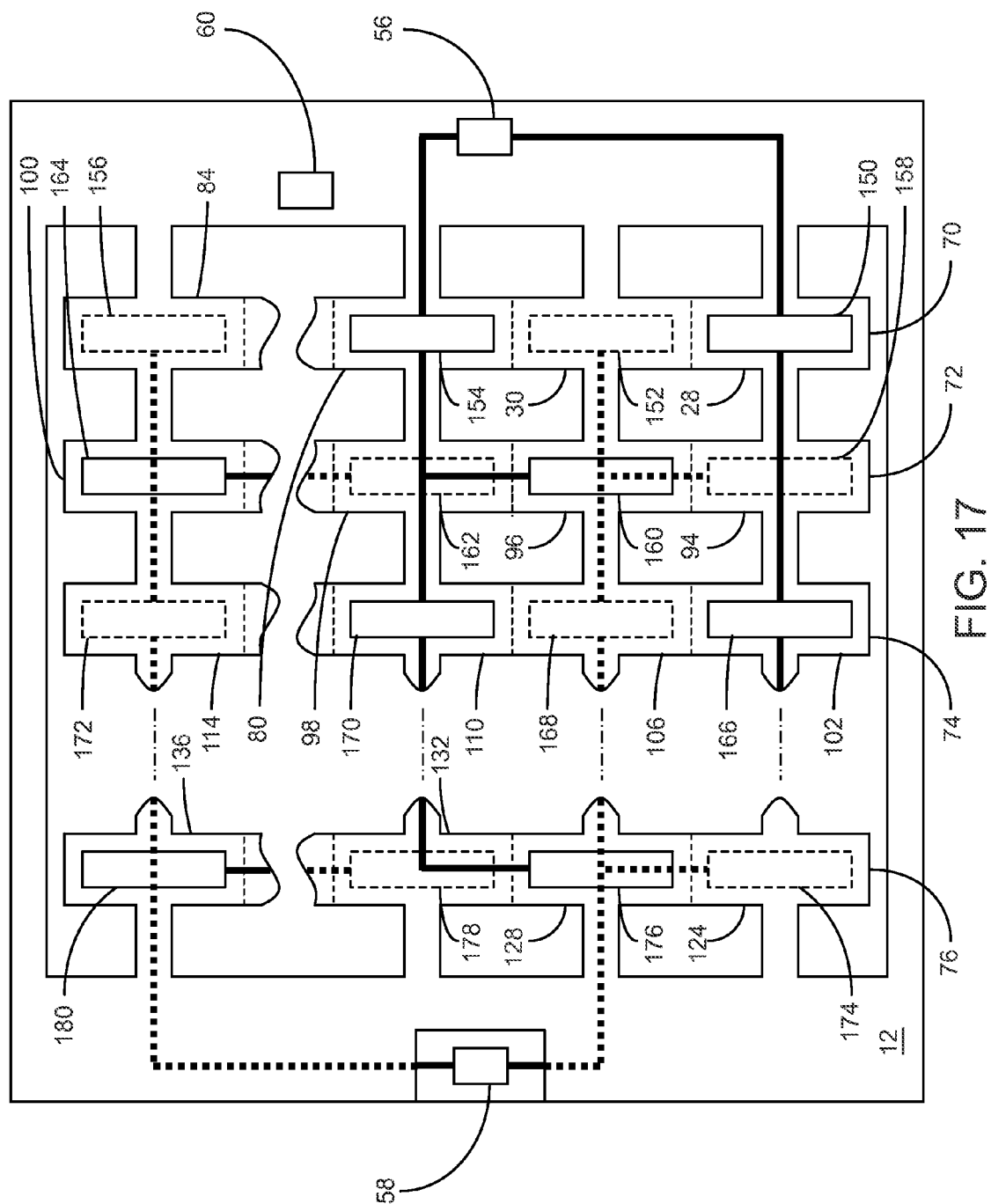
FIG. 17 shows a two-dimensional top-view of the array of multi-mode longitudinally resonating bodies illustrated in FIG. 11, according to a sixth embodiment of the resonating structure.

FIG. 17 shows a two-dimensional top-view of the array of multi-mode longitudinally resonating bodies illustrated in FIG. 11, according to a sixth embodiment of the resonating structure. The resonating structure includes an even number of multi-mode longitudinally resonating bodies 70, 72, 74, 76; therefore, M is an even number. Each of the multi-mode longitudinally resonating bodies 70, 72, 74, 76 is an N-mode longitudinally resonating body, wherein N is an even number. Therefore, each of the multi-mode longitudinally resonating bodies 70, 72, 74, 76 includes an even number, namely N, of longitudinally resonating segments.

The odd conducting areas 150, 154, 166, 170 of the odd multi-mode longitudinally resonating bodies 70, 74 and the even conducting areas 160, 164, 176, 180 of the even multi-mode longitudinally resonating bodies 72, 76 are electrically coupled to the drive connection node 56; therefore, the corresponding resonating segments 28, 80, 102, 110, 96, 100, 128, 136 are driven resonating segments. Similarly, the even conducting areas 152, 156, 168, 172 of the odd multi-mode longitudinally resonating bodies 70, 74 and the odd conducting areas 158, 162, 174, 178, of the even multi-mode longitudinally resonating bodies 72, 76 are electrically coupled to the sense connection node 58; therefore, the corresponding resonating segments 30, 84, 106, 114, 94, 98, 124, 132 are sensed resonating segments.

Any two adjacent resonating segments in any of the multi-mode longitudinally resonating bodies 70, 72, 74, 76 may resonate at about the same resonant frequency with about a 180 degree phase-shift with respect to one another. Any two adjacent resonating segments in any of the multi-mode longitudinally resonating bodies 70, 72, 74, 76 are such that one of the two adjacent resonating segments is a driven resonating segment and the other of the two adjacent resonating segments is a sensed resonating segment. Any two resonating segments, such that one of the two resonating segments is in any of the multi-mode longitudinally resonating bodies 70, 72, 74, 76 and is coupled via an intra-array coupler 78 to the other of the two resonating segments in an adjacent multi-mode longitudinally resonating body 70, 72, 74, 76, are such that one of the two resonating segments is a driven resonating segment and the other of the two resonating segments is a sensed resonating segment.

In another embodiment of the present invention, instead of the odd conducting areas 150, 154, 166, 170 of the odd multi-mode longitudinally resonating bodies 70, 74 and the even conducting areas 160, 164, 176, 180 of the even multi-mode longitudinally resonating bodies 72, 76 being electrically coupled to the drive connection node 56 and the even conducting areas 152, 156, 168, 172 of the odd multi-mode longitudinally resonating bodies 70, 74 and the odd conducting areas 158, 162, 174, 178 of the even multi-mode longitudinally resonating bodies 72, 76 being electrically coupled to the sense connection node 58, the odd conducting areas 150, 154, 166, 170 of the odd multi-mode longitudinally resonating bodies 70, 74 and the even conducting areas 160, 164, 176, 180 of the even multi-mode longitudinally resonating bodies 72, 76 are electrically coupled to the sense connection node 58 and the even conducting areas 152, 156, 168, 172 of the odd multi-mode longitudinally resonating bodies 70, 74 and the odd conducting areas 158, 162, 174, 178 of the even multi-mode longitudinally resonating bodies 72, 76 are electrically coupled to the drive connection node 56.

FIGS. 18A, 18B, and 18C show details of the intra-array coupler 78 between the first resonating segment 28 and the second body first resonating segment 94 in the first and second embodiments of the resonating structure illustrated in FIGS. 12 and 13. A potential disadvantage of the first and second embodiments of the resonating structure is illustrated by analysis of the first resonating segment 28 and the second body first resonating segment 94. Since the first resonating segment 28 and the second body first resonating segment 94 are both driven resonating segments, they tend to resonate in unison. Specifically, the multi-mode resonating length 148 of both first resonating segments 28, 94 is at a minimum simultaneously, as illustrated in FIG. 18A, is at a nominal value simultaneously, as illustrated in FIG. 18B, and is at a maximum simultaneously, as illustrated in FIG. 18C.

When both first resonating segments 28, 94 are at a minimum, the intra-array coupler 78 between them may become compressed and distorted, as illustrated in FIG. 18A. Similarly, when both first resonating segments 28, 94 are at a maximum, the intra-array coupler 78 between them may become expanded and distorted, as illustrated in FIG. 18C. Such distortions may increase losses in the resonating structure, which may reduce the quality factor of the resonating structure.

FIGS. 19A, 19B, and 19C show details of the intra-array coupler 78 between the first resonating segment 28 and the second body first resonating segment 94 in the third, fourth, fifth, and sixth embodiments of the resonating structure illustrated in FIGS. 14, 15, 16, and 17. Unlike the first and second embodiments of the resonating structure illustrated in FIGS. 12 and 13, the first resonating segment 28 is a driven resonating segment and the second body first resonating segment 94 is either a sensed resonating segment or is neither sensed nor driven. Therefore, the second body first resonating segment 94 may tend to resonate about 180 degrees out of phase with respect to the first resonating segment 28.

Specifically, when the multi-mode resonating length 148 of the first resonating segment 28 is at a minimum, the multi-mode resonating length 148 of the second body first resonating segment 94 may be at a maximum, as illustrated in FIG. 19A. Likewise, when the multi-mode resonating length 148 of the first resonating segment 28 is at a maximum, the multi-mode resonating length 148 of the second body first resonating segment 94 may be at a minimum, as illustrated in FIG. 19C. Both first resonating segments 28, 94 may have a nominal multi-mode resonating length 148 simultaneously, as illustrated in FIG. 19B. When one of the first resonating segments 28, 94 is compressing the intra-array coupler 78, the other of the first resonating segments 28, 94 is expanding the intra-array coupler 78, and vice versa. Therefore, the 180 degree phase-shift may reduce distortions of the intra-array coupler 78, which may improve the quality factor of the resonating structure.

FIGS. 20A and 20B illustrate details of a dual-clamped beam anchor 182 as an alternative to the anchor 14, according to one embodiment of the present invention. The anchor 14 provides a single attachment point to the supporting structure 12, as illustrated in FIG. 20A. However, the dual-clamped beam anchor 182 provides two attachment points to the supporting structure 12, as illustrated in FIG. 20B. The dual-clamped beam anchor 182 has a beam 184 that is parallel to a resonating segment, such as the first resonating segment 28, and has a beam length 186 between the two attachment points and a beam width 188.

Used with the proper beam length 186 and beam width 188, the dual-clamped beam anchor 182 may increase mechanical strength and improve the quality factor of the resonator array when compared with the anchor 14. Proper beam length 186 and beam width 188 may be related to resonator frequency by the following equation:

$$f_o = (1.03)\frac{Wb}{Lb^2}\sqrt{\frac{E}{\rho}},\qquad\text{Eq. 2}$$

where Wb is the beam width 188, Lb is the beam length 186, and E and $\rho$ are the Young's modulus and density of the resonator material, respectively.

FIG. 20C illustrates details of a symmetric tuning fork beam anchor 190 as an alternative to the anchor 14, according to an alternate embodiment of the present invention. The anchor 14 provides a single attachment point to the supporting structure 12, as illustrated in FIG. 20A.

However, the symmetric tuning fork beam anchor 190 provides two attachment points to the supporting structure 12, as illustrated in FIG. 20C. The symmetric tuning fork beam anchor 190 has a tuning fork 192 that is parallel to a resonating segment, such as the first resonating segment 28, and has a tuning fork length 194 between the two attachment points and a tuning fork width 196.

Those skilled in the art will recognize improvements and modifications to the preferred embodiments of the present invention. All such improvements and modifications are considered within the scope of the concepts disclosed herein and the claims that follow.

What is claimed is:

1. A multi-mode micro-electromechanical systems (MEMS) resonator system comprising:
   a supporting structure; and
   a plurality of longitudinally resonating bodies coupled in parallel with one another along a first axis to form a resonating structure, which is suspended from the supporting structure, each of the plurality of longitudinally resonating bodies having a plurality of resonating segments adjacent to one another along a second axis, which is approximately perpendicular to the first axis, and each of the plurality of resonating segments having and resonating longitudinally about a null axis, such that the resonating structure comprises:
   a resonating device layer;
   a first conducting layer; and
   a first insulating layer between the resonating device layer and the first conducting layer.

2. The multi-mode MEMS resonator system of claim 1 wherein any two adjacent resonating segments in at least one of the plurality of longitudinally resonating bodies resonate at about a first resonant frequency with about a 180 degree phase-shift with respect to one another.

3. The multi-mode MEMS resonator system of claim 1 wherein:
   the supporting structure comprises a drive connection node and a sense connection node;
   a first driven resonating segment in one of the plurality of longitudinally resonating bodies comprises a conducting area, which is electrically coupled to the drive connection node; and
   a first sensed resonating segment in the one of the plurality of longitudinally resonating bodies comprises a conducting area, which is electrically coupled to the sense connection node.

4. The multi-mode MEMS resonator system of claim 3 further comprising drive circuitry adapted to provide an alternating current (AC) drive signal to the drive connection node, wherein the sense connection node is adapted to provide a sense signal based on the AC drive signal and resonance characteristics of the resonating structure.

5. The multi-mode MEMS resonator system of claim 3 wherein the first driven resonating segment is adjacent to the first sensed resonating segment.

6. The multi-mode MEMS resonator system of claim 1 wherein the first insulating layer, the resonating device layer, and the first conducting layer are associated with at least one of the plurality of resonating segments to form at least one electrostatic resonating element.

7. The multi-mode MEMS resonator system of claim 1 wherein the first insulating layer, the resonating device layer, and the first conducting layer are associated with at least one of the plurality of resonating segments to form at least one piezoelectric resonating element.

8. The multi-mode MEMS resonator system of claim 1 wherein the first insulating layer, the resonating device layer, and the first conducting layer are associated with at least one of the plurality of resonating segments to form at least one electrostrictive resonating element.

9. The multi-mode MEMS resonator system of claim 1 wherein the resonating device layer comprises Silicon.

10. The multi-mode MEMS resonator system of claim 1 wherein the resonating device layer comprises single-crystal Silicon.

11. The multi-mode MEMS resonator system of claim 1 wherein the first insulating layer comprises one of Zinc Oxide, Lead Zirconate Titanate (PZT), Aluminum Nitride (AlN), Lithium Tantalate (LT), and Lithium Niobate (LN).

12. The multi-mode MEMS resonator system of claim 1 wherein:
a complementary metal-oxide-semiconductor (CMOS) process is associated with providing at least one of the resonating structure and the supporting structure;
the first insulating layer comprises gate oxide; and
the first conducting layer comprises poly-Silicon.

13. The multi-mode MEMS resonator system of claim 1 wherein a Silicon device layer of a Silicon-on-insulator (SOI) wafer provides the resonating device layer.

14. The multi-mode MEMS resonator system of claim 1 wherein the resonating structure further comprises
a second conducting layer, and
the resonating device layer is between the first conducting layer and the second conducting layer, and the first conducting layer, the resonating device layer, and the second conducting layer are associated with at least one of the plurality of resonating segments to form at least one piezoelectric resonating element.

15. The multi-mode MEMS resonator system of claim 14 wherein the resonating device layer comprises one of Zinc Oxide, Lead Zirconate Titanate (PZT), Aluminum Nitride (AlN), Lithium Tantalate (LT), and Lithium Niobate (LN).

16. A multi-mode micro-electromechanical systems (MEMS) resonator system comprising:
a supporting structure comprising a first drive connection node, a second sense connection node, and a third direct current (DC) connection node adapted to receive a DC input signal, and a sense signal based on the DC input signal;
a plurality of longitudinally resonating bodies coupled in parallel with one another along a first axis to form a resonating structure, which is suspended from the supporting structure, each of the plurality of longitudinally resonating bodies having a plurality of resonating segments adjacent to one another along a second axis, which is approximately perpendicular to the first axis, and each of the plurality of resonating segments having and resonating longitudinally about a null axis, such that:
a first driven resonating segment in one of the plurality of longitudinally resonating bodies comprises a conducting area, which is electrically coupled to the drive connection node; and
a first sensed resonating segment in the one of the plurality of longitudinally resonating bodies comprises a conducting area, which is electrically coupled to the sense connection node; and
drive circuitry adapted to provide an alternating current (AC) drive signal to the drive connection node, wherein the sense connection node is adapted to provide the sense signal based on the AC drive signal and resonance characteristics of the resonating structure.

17. The multi-mode MEMS resonator system of claim 16 wherein a magnitude of the DC input signal is about ground.

18. A multi-mode micro-electromechanical systems (MEMS) resonator system comprising:
a supporting structure comprising a drive connection node and a sense connection node; and
a plurality of longitudinally resonating bodies coupled in parallel with one another along a first axis to form a resonating structure, which is suspended from the supporting structure, each of the plurality of longitudinally resonating bodies having a plurality of resonating segments adjacent to one another along a second axis, which is approximately perpendicular to the first axis, and each of the plurality of resonating segments having and resonating longitudinally about a null axis, such that the resonating structure comprises:
a resonating device layer;
a first conducting layer;
a first insulating layer between the resonating device layer and the first conducting layer;
a first driven resonating segment in one of the plurality of longitudinally resonating bodies comprises a conducting area, which is electrically coupled to the drive connection node;
a first sensed resonating segment in the one of the plurality of longitudinally resonating bodies comprises a conducting area, which is electrically coupled to the sense connection node;
a second driven resonating segment in another of the plurality of longitudinally resonating bodies comprises a conducting area, which is electrically coupled to the drive connection node;
a second sensed resonating segment in the another of the plurality of longitudinally resonating bodies comprises a conducting area, which is electrically coupled to the sense connection node;
a first intra-array coupler couples the first sensed resonating segment to the second sensed resonating segment; and
a second intra-array coupler couples the first driven resonating segment to the second driven resonating segment.

19. A multi-mode micro-electromechanical systems (MEMS) resonator system comprising:
a supporting structure comprising a drive connection node and a sense connection node; and
a plurality of longitudinally resonating bodies coupled in parallel with one another along a first axis to form a resonating structure, which is suspended from the supporting structure, each of the plurality of longitudinally resonating bodies having a plurality of resonating segments adjacent to one another along a second axis, which is approximately perpendicular to the first axis, and each of the plurality of resonating segments having and resonating longitudinally about a null axis, such that the resonating structure comprises:

a resonating device layer;

a first conducting layer;

a first insulating layer between the resonating device layer and the first conducting layer;

a first driven resonating segment in one of the plurality of longitudinally resonating bodies comprises a conducting area, which is electrically coupled to the drive connection node;

a first sensed resonating segment in the one of the plurality of longitudinally resonating bodies comprises a conducting area, which is electrically coupled to the sense connection node;

a second driven resonating segment in another of the plurality of longitudinally resonating bodies comprises a conducting area, which is electrically coupled to the drive connection node;

a second sensed resonating segment in the another of the plurality of longitudinally resonating bodies comprises a conducting area, which is electrically coupled to the sense connection node;

a first intra-array coupler couples the first sensed resonating segment to the first driven resonating segment; and a second intra-array coupler couples the second driven resonating segment to the second sensed resonating segment.

20. A multi-mode micro-electromechanical systems (MEMS) resonator system comprising:

a supporting structure comprising a drive connection node and a sense connection node; and a plurality of longitudinally resonating bodies coupled in parallel with one another along a first axis to form a resonating structure, which is suspended from the supporting structure, each of the plurality of longitudinally resonating bodies having a plurality of resonating segments adjacent to one another along a second axis, which is approximately perpendicular to the first axis, and each of the plurality of resonating segments having and resonating longitudinally about a null axis, such that the resonating structure comprises:

a resonating device layer;

a first conducting layer;

a first insulating layer between the resonating device layer and the first conducting layer;

a first driven resonating segment in a first of the plurality of longitudinally resonating bodies comprises a conducting area, which is electrically coupled to the drive connection node;

a first sensed resonating segment in the first of the plurality of longitudinally resonating bodies comprises a conducting area, which is electrically coupled to the sense connection node;

a second of the plurality of longitudinally resonating bodies comprises a first resonating segment and a second resonating segment;

a second driven resonating segment in a third of the plurality of longitudinally resonating bodies comprises a conducting area, which is electrically coupled to the drive connection node;

a second sensed resonating segment in the third of the plurality of longitudinally resonating bodies comprises a conducting area, which is electrically coupled to the sense connection node;

a first intra-array coupler couples the first sensed resonating segment to the first resonating segment;

a second intra-array coupler couples the first resonating segment to the second sensed resonating segment;

a third intra-array coupler couples the first driven resonating segment to the second resonating segment; and a fourth intra-array coupler couples the second resonating segment to the second driven resonating segment.

21. A multi-mode micro-electromechanical systems (MEMS) resonator system comprising:

a supporting structure;

a plurality of longitudinally resonating bodies coupled in parallel with one another along a first axis to form a resonating structure, which is suspended from the supporting structure, each of the plurality of longitudinally resonating bodies having a plurality of resonating segments adjacent to one another along a second axis, which is approximately perpendicular to the first axis, and each of the plurality of resonating segments having and resonating longitudinally about a null axis, such that the resonating structure comprises:

a resonating device layer;

a first conducting layer;

a first insulating layer between the resonating device layer and the first conducting layer;

a plurality of anchors that couple the resonating structure at null axes to the supporting structure; and a plurality of intra-array couplers that couple adjacent pairs of the plurality of longitudinally resonating bodies to one another at null axes.

22. The multi-mode MEMS resonator system of claim 21 wherein a length of one of the plurality of anchors is equal to about one-quarter of a wavelength of a resonant frequency of one of the plurality of longitudinally resonating bodies.

23. The multi-mode MEMS resonator system of claim 21 wherein the plurality of anchors comprises a plurality of dual-clamped beam anchors, such that each of the plurality of dual-clamped beam anchors comprises a beam, which is attached at either end to the supporting structure.

24. The multi-mode MEMS resonator system of claim 21 wherein the plurality of anchors comprises a plurality of symmetric tuning fork beam anchors, such that each of the plurality of symmetric tuning fork beam anchors comprises a tuning fork, which is attached at either end to the supporting structure.

25. The multi-mode MEMS resonator system of claim 21 wherein a length of one of the plurality of resonating segments is equal to about one-half of a wavelength of a resonant frequency of one of the plurality of longitudinally resonating bodies.

* * * * *